United States Patent
Liaw

(10) Patent No.: US 9,672,903 B2
(45) Date of Patent: Jun. 6, 2017

(54) TWO-PORT SRAM CONNECTION STRUCTURE

(71) Applicant: Taiwan Semiconductor Manufacturing Co., Ltd., Hsin-Chu (TW)

(72) Inventor: Jhon Jhy Liaw, Zhudong Township, Hsinchu County (TW)

(73) Assignee: TAIWAN SEMICONDUTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/253,365

(22) Filed: Aug. 31, 2016

(65) Prior Publication Data
US 2016/0372182 A1 Dec. 22, 2016

(51) Int. Cl.
| G11C 11/419 | (2006.01) |
| H01L 27/11 | (2006.01) |
| B81B 3/00 | (2006.01) |
| B81C 1/00 | (2006.01) |
| G11C 5/06 | (2006.01) |
| H01L 23/528 | (2006.01) |

(52) U.S. Cl.
CPC .......... *G11C 11/419* (2013.01); *B81B 3/0051* (2013.01); *B81C 1/00238* (2013.01); *B81C 1/00246* (2013.01); *B81C 1/00253* (2013.01); *G11C 5/063* (2013.01); *H01L 23/528* (2013.01); *H01L 27/1104* (2013.01); *H01L 27/1116* (2013.01); *B81B 2207/015* (2013.01); *B81B 2207/096* (2013.01); *B81C 2203/0118* (2013.01); *B81C 2203/035* (2013.01); *B81C 2203/0742* (2013.01); *B81C 2203/0764* (2013.01); *B81C 2203/0778* (2013.01)

(58) Field of Classification Search
CPC ...... G11C 11/419; G11C 5/063; H01L 27/116
See application file for complete search history.

(56) References Cited

U.S. PATENT DOCUMENTS

| 5,973,985 | A | * | 10/1999 | Ferrant | G11C 8/16 365/154 |
| 6,127,843 | A | * | 10/2000 | Agrawal | H03K 19/1776 326/40 |
| 6,661,733 | B1 | * | 12/2003 | Pan | H03K 19/1776 365/154 |
| 6,992,947 | B1 | * | 1/2006 | Pan | H03K 19/1776 365/154 |
| 7,813,161 | B2 | * | 10/2010 | Luthra | G11C 8/16 365/154 |

(Continued)

*Primary Examiner* — Evan Pert
(74) *Attorney, Agent, or Firm* — Haynes and Boone, LLP

(57) ABSTRACT

A static random access memory (SRAM) device is provided in accordance with some embodiments. The SRAM device comprises a plurality of two-port SRAM arrays, which comprise a plurality of two-port SRAM cells. Each two-port SRAM cell comprises a write port portion, a read port portion, a first plurality of metal lines located in a first metal layer, a second plurality of metal lines located in a second metal layer, a third plurality of metal lines located in a third metal layer a plurality of edge cells, a plurality of well strap cells, and a plurality of jumper structures. Each jumper structure comprises first, second, and third metal landing pads located in the second metal layer and electrically connecting metal lines of the first and third metal layers.

20 Claims, 20 Drawing Sheets

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 8,891,289 B2 * | 11/2014 | Hwang ................ G11C 11/412 365/154 |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |

* cited by examiner

FIG. 13A

TWO-PORT SRAM CONNECTION STRUCTURE

BACKGROUND

In deep sub-micron integrated circuit (IC) technology, an embedded static random access memory (SRAM) device has become a popular storage unit of high speed communication, image processing and system-on-chip (SOC) products. For example, a dual port (DP) SRAM device allows parallel operation, such as 1R (read) 1W (write), or 2R (read) in one cycle, and therefore has higher bandwidth than a single port SRAM. In advanced technologies with decreased feature size and increased packing density, low loading and high speed of the cell structure are important factors in embedded memory and SOC products.

As lithography methods used in IC fabrication continually improve to allow smaller and smaller feature sizes to be created in metal and semiconductor features, the pitch (i.e., the center-to-center or edge-to-edge distance) between features continually decreases. In advanced process nodes such as 10 nm or below, restricted design rules in layout are adopted for extending the capabilities of existing lithography tools, such as 193-nm immersion lithography. These restrictions include uni-directional routing and fixed (i.e., uniform) pitch between metal lines. The uni-directional routing rule for metal lines in conjunction with the fixed pitch routing rule may create situations where metal lines cannot be properly aligned between adjoining regions of a chip that are not subject to the same routing rules, e.g., between an SRAM cell region and a peripheral logic region, therefore preventing electrical connection between the two chip regions. Improvements in these areas are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 8A, 9A, 10A, 11A, 12A, and 13A illustrate block diagrams of an SRAM cell array according to alternative embodiments of the present disclosure.

DETAILED DESCRIPTION

Figure 1:
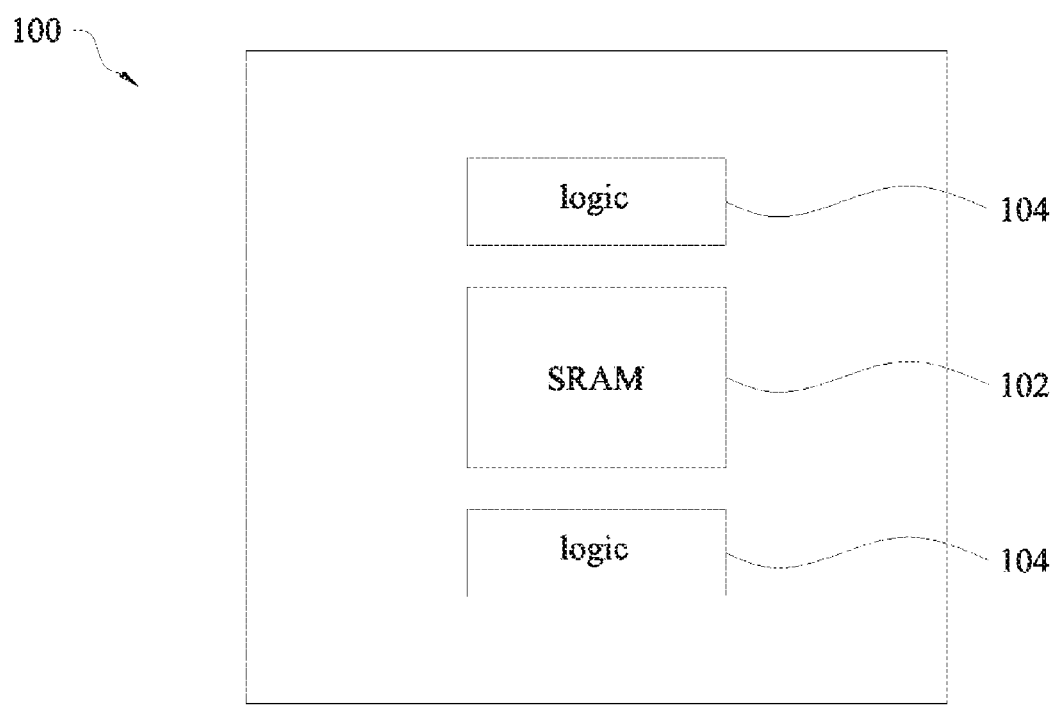
FIG. 1 illustrates an integrated circuit including static random access memory (SRAM) arrays and peripheral logic circuits, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to semiconductor devices and methods of forming the same. More particularly, the present disclosure is related to a new and improved jumper structure for use in metal line layers in semiconductor device manufacturing subject to restricted design rules. In embodiments of the present disclosure, the jumper is formed of a conductive metal and, in combination with metal vias in adjoining via layers, provides electrical connection between elements in one or more other metal layers or device layers. For example, two metal lines in a first metal layer may be misaligned, a jumper may be placed in a second metal layer, and metal vias may be formed to electrically connect the jumper to each of the metal lines, thus allowing them to be electrically connected despite their misalignment. The new jumper may be used in multi-layer interconnect formation for integrated circuits (IC) as well as other areas that may be recognized by persons having ordinary skill in the pertinent art. Various aspects of the new jumper are discussed below in the context of multi-layer interconnect formation for an IC 100.

The IC 100 is provided for illustration purposes and does not necessarily limit the embodiments of the present disclosure to any number of devices, any number of regions, or any configuration of structures or regions. Furthermore, the IC 100 may comprise static random access memory (SRAM) and/or logic circuits, passive components such as resistors, capacitors, and inductors, and active components such as p-type FETs (PFETs), n-type FETs (NFETs), Fin-FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

FIG. 1 illustrates a block diagram of the IC 100 according to an embodiment of the present disclosure. The IC 100 includes at least one transistor-based static random access memory (SRAM) array area 102 and at least one peripheral logic area 104. In some embodiments, an SRAM array area 102 may be bordered on multiple sides by peripheral logic areas 104. There may be other components formed in IC 100 which are not described herein. The IC 100 may include multiple layers, and each layer may contain metal features, semiconductor features, or the like. For example, semiconductor transistor features may be formed in a semiconductor layer, and various layers of metal lines formed above the semiconductor layer may serve to electrically connect the semiconductor features to form circuitry. In some embodiments, the IC 100 may be an SRAM.

The SRAM array area 102 contains at least one semiconductor layer that contains transistor-based SRAM circuitry, described below with reference to FIG. 2. The SRAM array area 102 contains at least three metal layers, each of which contain metal lines that provide electrical connection between elements of the SRAM circuitry, and which facilitate interconnection with logic circuitry of a logic area 104. The metal layers of the SRAM array area 102 may contain metal lines that vary in size and pitch. For example, power-conducting lines may be wider than non-power-conducting metal lines. Because metal layers of the SRAM array area 102 may have features of various sizes, the layout of the features may be somewhat irregular and there may not be a uniform pitch across the metal layers of the SRAM array area 102.

The logic area 104 contains at least one semiconductor layer that contains transistor-based logic circuitry, and at least three metal layers, each of which contain metal lines that provide electrical connection between elements of the logic circuitry, and which facilitate interconnection with the SRAM circuitry of SRAM array area 102. In some embodiments, the logic area 104 may be manufactured using advanced lithography processing nodes, and accordingly design rules for the logic area 104 may dictate that the pitch of the metal lines in the metal layers be uniform across the logic area 104. Additionally, design rules required by advanced processing nodes may dictate that the metal lines of the logic area 104 be uniform in size. As a result of these design rule restrictions on the pitch and uniform size of metal lines in the logic area 104, there may be a misalignment between metal lines of the logic area 104 and metal lines of the SRAM array area 102 where the two areas interface, as will be further described below.

Figure 2:
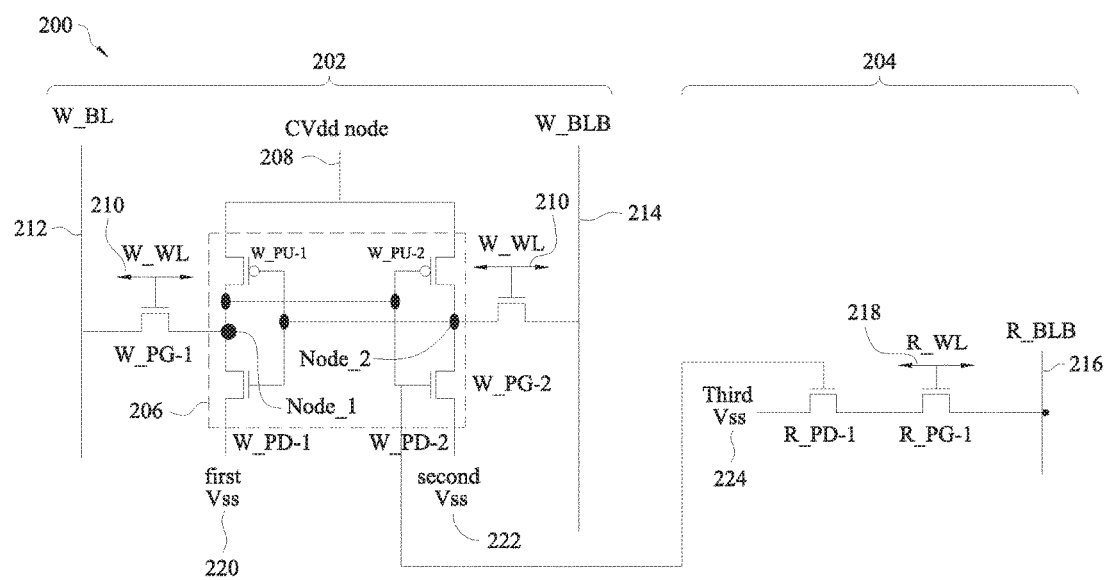
FIG. 2 illustrates a circuit diagram for one two-port SRAM cell of an SRAM array on an SRAM chip, in accordance with an embodiment of the present disclosure.

Referring now to FIG. 2, there is illustrated a circuit diagram for a two-port SRAM cell 200 of an SRAM array in the SRAM array area 102 of the IC 100 in accordance with an embodiment of the present disclosure. In this embodiment, the two-port SRAM cell 200 has 8 transistors. The two-port SRAM cell 200 has a write port portion 202 and a read port portion 204. The write port portion 202 contains the data storage portion of the two-port SRAM cell 200 in the data latch 206, which can store one bit of information. Power is provided to the write port portion 202 by positive voltage node 208 (e.g., a supply voltage line), first negative voltage node 220 (e.g., a first return voltage line), and second negative voltage node 222 (e.g., a second return voltage line). So long as power is provided to the data latch 206, the data latch 206 will reach a steady state of either logic low (i.e., logic "0") or logic high (i.e., logic "1"). The write port portion 202 also includes a pair of write bit lines, write bit line 212 and inverse write bit line 214, which facilitate overwriting of the steady state as will be further described below. These write bit lines 212 and 214 may be called local write bit lines. The read port portion 204 includes a read bit line 216, which facilitates reading the state of data latch 206 as will be further described below. The read bit line 216 may be called a local read bit line. Power is provided to the read port portion 204 by positive voltage node 208 and third negative voltage node 224.

In this embodiment, the write port portion 202 includes write port pull-up transistors W_PU1 and W_PU2, write port pull-down transistors W_PD1 and W_PD2, and write port pass-gate transistors W_PG1 and W_PG2. The drains of pull-up transistor WPU1 and pull-down transistor W_PD1 are interconnected, and the drains of pull-up transistor W_PU2 and pull-down transistor W_PD2 are interconnected. Transistors W_PU1, W_PU2, W_PD1, and W_PD2 are cross-coupled to form the data latch 206 (i.e., a pair of cross-coupled inverters). Storage node Node_1 of the data latch is coupled to write bit line 212 (i.e., W_BL) through write port pass-gate transistor W_PG1, while storage node Node_2 is coupled to inverse write bit line 214 W_BLB through write port pass-gate transistor W_PG2, wherein storage nodes Node_1 and Node_2 are complementary nodes that are often at opposite logic levels (e.g., logic high or logical low). The gates of write port pass-gate transistors W_PG1 and W_PG2 are connected to write word line 210 (i.e., W_WL).

In this embodiment, the read port portion 204 includes read port pull-down transistor R_PD and read port pass-gate transistor R_PG. The gate of read port pass-gate transistor R_PG is connected to read word line 218 (i.e., R_WL), which is electrically and physically separated from write word line 210. When write operations are performed, read port pass-gate transistor R_PG is turned off, and write port pass-gate transistors W_PG1 and W_PG2 are turned on. The data is thus written into the two-port SRAM cell 200 through write bit line 212 and inverse write bit line 214. Conversely, when read operations are performed, write port pass-gate transistors W_PG1 and W_PG2 are turned off, and read port pass-gate transistor R_PG is turned on. The data is thus read into read bit line 216.

Figure 3:
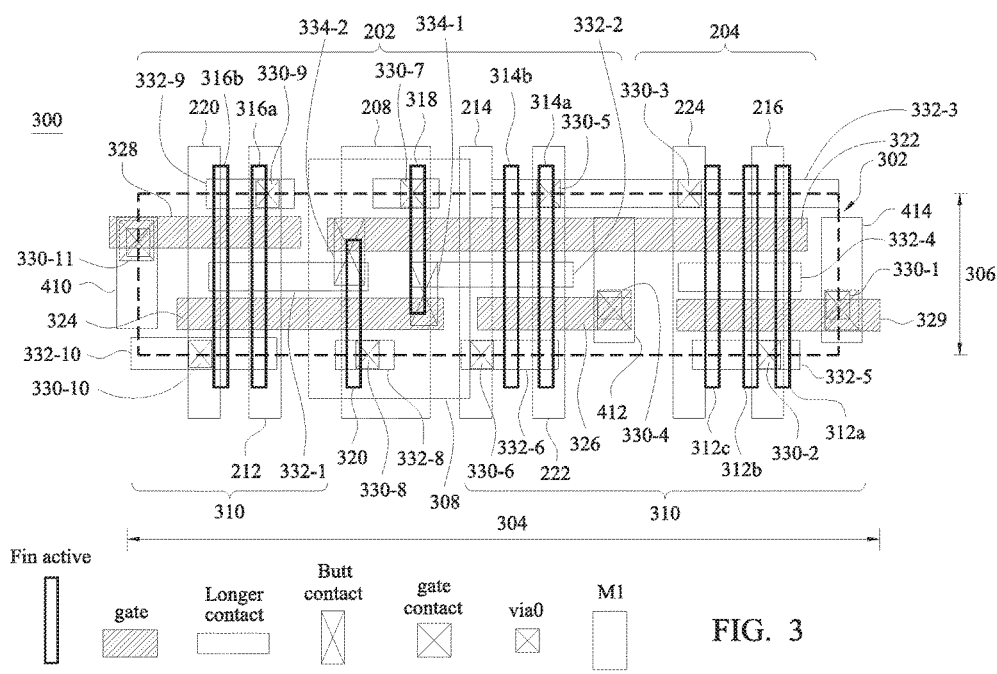
FIG. 3 illustrates a top view of a two-port SRAM cell of FIG. 2 in accordance with an embodiment of the present disclosure.
Figure 5:
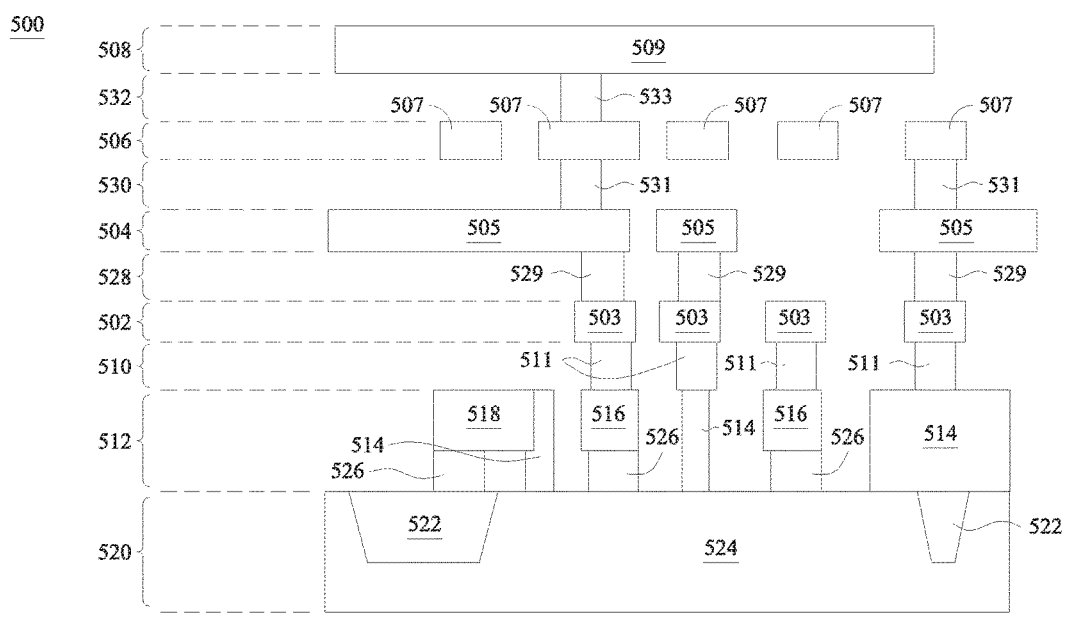
FIG. 5 illustrates a side view of an exemplary metal layer structure in accordance with an embodiment of the present disclosure.

Referring now to FIG. 3, there is illustrated a top view 300 of a two-port SRAM cell 200 in accordance with an embodiment of the present disclosure. FIG. 5 will be described in conjunction with FIG. 3, and illustrates a side view 500 of an exemplary metal layer structure in accordance with an embodiment of the present disclosure. The top view 300 illustrates the layout of a substrate layer (e.g., substrate layer 520 of FIG. 5), a contact layer (e.g., contact layer 512 of FIG. 5), a via layer (e.g., first via layer 510 of FIG. 5), and a metal layer M1 above the substrate layer (e.g., first metal layer or M1 layer 502 of FIG. 5).

The substrate layer (e.g., substrate layer 520) is a semiconductor substrate that includes silicon. Alternatively, the substrate includes germanium, silicon germanium or other proper semiconductor materials. The semiconductor substrate may include other proper features and structures. In one embodiment, the semiconductor substrate employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR).

The Two-port SRAM cell 200 is formed in a unit cell region 302 of the semiconductor substrate. In one embodiment, the unit cell region 302 is defined in a rectangular shape spanning to a first dimension 304 in a first direction and spanning to a second dimension 306 in a second direction perpendicular to the first direction. The first dimension 304 is longer than the second dimension 306. The first and second dimensions (304 and 306) are referred to as a longer pitch and a shorter pitch, respectively. The Two-port SRAM cell 200 includes a N-well region 308 disposed in the central portion of the cell. The Two-port SRAM cell 200 further includes a P-well region 310 disposed on both sides of the N-well 308. In one embodiment, the N-well 308 and P-well 310 are extended to multiple cells beyond the unit cell boundary. For example, the N-well 308 and P-well 310 are extended to 4 or more cells in the second direction.

Various active regions are defined in the substrate and are isolated from each other by the isolation features. The isolation features are formed in the semiconductor substrate with a proper technology. In one embodiment, the isolation features are formed by a shallow trench isolation (STI) technique. In another embodiment, the isolation features are alternatively formed by a local oxidation of silicon (LOCOS) technique. In yet another embodiment, the formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. The active regions are defined in the semiconductor substrate upon the formation of the isolation features.

The Two-port SRAM cell 200 utilizes fin active regions (fin active features) to form fin transistors, such as FinFETs. The fin active regions are formed on the semiconductor substrate and defined within the Two-port SRAM cell 200. The fin active regions are formed by a suitable technology and may be formed in a process to form both the STI features and the fin active regions. In one embodiment, the fin active regions are formed by a process including etching a semiconductor to form trenches and partially filling the trenches to form shallow trench isolation (STI) features and fin active regions interdigitated with each other. In furtherance of the present embodiment, an epitaxy semiconductor layer is selectively formed on the fin active regions. In another embodiment, the fin active regions are formed by a process including depositing a dielectric material layer on a semiconductor substrate, etching the dielectric material layer to form openings therein, and selectively epitaxially growing a semiconductor material (such as silicon) on the semiconductor substrate within the openings to form the fin active regions and the isolation features. In yet another embodiment, the various FinFETs may include strained features for enhanced mobility and device performance. For example, the pFinFETs include epitaxially grown silicon germanium on a silicon substrate.

In one embodiment, the Two-port SRAM cell 200 includes a first active region 312, a second active region 314, and a third active region 316 formed in the P-well 310. The two-port SRAM cell 200 further includes a fourth active region 318 and a fifth active region 320 formed in the N-well 308. The first active region 312 through the fifth active region 320 are disposed along the second dimension 306. The first through fifth active regions or a subset thereof may be extended to multiple cells, such as 4 or more cells in the second direction.

In one embodiment, each of the active regions includes one or more fin active features configured to form various FinFETs. In another embodiment, at least some of the first active region 312 through the third active region 316 in the P-well 310 include multiple fin active features. In each fin active feature, a pull-down device (PD), a pass-gate device (PG), or a combination thereof can be formed. Each of the PD and PG devices may include one or more finFETs. Particularly, each fin active feature includes one PD, one PG, or one PD/PG (one PD and one PG). In the present embodiment, the first active region 312 includes three fin active features lined up, referred to as 312 a, 312 b and 312 c, respectively, and oriented in the second dimension 306. The fin active feature 312 b is interposed between the fin active features 312 a and 312 c. The pass-gate R_PG-2 and the pull-down device R_PD-1 are formed on the fin active features 312. These two devices form the read port portion 204 of the two-port SRAM cell 200.

The write port portion 202 of the two-port SRAM cell 200 includes the second through fifth active regions 314 through 320. The second active region 314 includes two fin active features lined up, referred to as 314 a and 314 b, respectively. The pull-down device W_PD-2 and the pass-gate device W_PG-2 are formed on the fin active features 314a and 314b. Similarly, for a balanced structure of the two-port SRAM cell 200, the third active region 316 includes two fin active features lined up, referred to as 316a and 316 b, respectively. The pull-down device W_PD-1 and the pass-gate device W_PG-1 are formed on the fin active features 316a and 316b.

Various gate features are formed within the Two-port SRAM cell 200 for various nFinFETs and pFinFETs. A gate feature includes a gate dielectric layer (such as silicon oxide) and a gate electrode (such as doped polysilicon) disposed on the gate dielectric layer. In another embodiment, the gate feature alternatively or additionally includes other proper materials for circuit performance and manufacturing integration. For example, the gate dielectric layer includes high k dielectric material layer. The gate electrode includes metal, such as aluminum, copper, tungsten or other proper conductive material. Various gates are oriented in the first dimension 304 and configured with the various active regions to form the pull-up devices, pull-down devices and pass-gate devices.

In the present embodiment, a long gate 322 is disposed over the first fin active features 312 a, 312 b, and 312c, the second fin active features 314a and 314b, and further extends over the fin active feature of the fourth active region 318, forming R_PD-1, W_PD-2, and W_PU-2, respectively. Similarly, another long gate 324 is disposed over the fin active features 316a and 316b, and further extends over the fin active feature of fifth active region 320, forming W_PD-1 and W_PU-1, respectively. A short gate 326 is disposed on the fin active features 314a and 314b, and is configured to form W_PG-1. Similarly, another short gate 328 is disposed on the fin active features 316a and 316b and is configured to form W_PG-1. A third short gate 329 is disposed on the fin active features 312a, 312b, and 312c and is configured to form R_PG-1.

In another embodiment of the configuration as illustrated in FIG. 3, the second active region 314 and the third active region 316 in the P-well 310 and the associated pull-down devices and pass-gate devices are symmetrically disposed on the two sides of the N-well 308 with symmetrical interconnect routing.

In one embodiment, the drain of W_PD-2 is electrically connected to the source of W_PG-2 by sharing a common doped region, a region defined in the fin active region 314 and positioned between the W_PD-2 and W_PG-2. Similarly, the drain of R_PD-1 is electrically connected to the source of R_PG-1 by sharing a common doped region, a region defined in the fin active region 312 and positioned between the R_PD-1 and R_PG-1.

In another embodiment, the drain of W_PD-2 is electrically connected to the source of W_PG-2 by a silicide feature (not shown) formed on the common doped region within the fin active region 314. The silicide feature is formed by a process known in the art such as self-aligned silicide (salicide) and can be formed together with other contact silicide in a same processing procedure.

In yet another embodiment, the drain of W_PD-2 is electrically connected to the source of W_PG-2 by a contact feature designed to contact both the drain of W_PD-2 and the source of W_PG-2. The geometries of the contacts are to be further described later. Similarly, the drain of W_PD-1 and the source of W_PG-1 are electrically connected in a way similar to the connection between the drain of W_PD-2 and the source of W_PG-2, such as by a silicide feature.

The two-port SRAM cell 200 further includes a plurality of first vias 330 on gates, drain nodes, voltage nodes, and various landing pads (such as silicide features). The first vias are positioned and configured for routing, including electrically connecting contacts in a contact layer (e.g., contact layer 512 of FIG. 5), which are in electrical contact with the doped regions or the gates (e.g., in substrate layer 524 of FIG. 5), to a first metal layer M1 (e.g., first metal layer M1 502 of FIG. 5). Additionally or alternatively, the first vias are designed to have various geometries to function as a local interconnect. The vias may be, for example, the plurality of first vias 511 of FIG. 5, which are formed in a first via layer 510 that electrically connects elements in the contact layer 512 to the first metal layer M1 502.

In one embodiment, one or more vias in the two-port SRAM cell 200 are designed in a square shape, such as the plurality of first vias 330-1 through 330-11. In one example, first vias 330-1 through 330-11 are routed to corresponding metal lines in the first metal layer M1.

In various embodiments, the first via 330-1 is routed to the read word line 218; the first via 330-2 is routed to the read bit line 216; the first via 330-3 is routed to the third negative voltage node 224; the first via 330-4 is routed to the write word line 210; the first via 330-5 is routed to the second negative voltage node 222; the first via 330-6 is routed to the inverse write bit line 214; the first vias 330-7 and 330-8 are routed to the positive voltage node 208; the first via 330-9 is routed to the write bit line 212; the first via 330-10 is routed to the first negative voltage node 220; and the first via 330-11 is routed to write word line 210.

In another embodiment, one or more contact features 332 are designed in a rectangular shape oriented in the first dimension 304 to function as contacting drain and source features between devices. For example, the contact feature 332-1 is designed to electrically connect the drains of W_PD-1 and W_PU-1; and the contact feature 332-2 is designed to electrically connect the drains of W_PD-2 and W_PU-2. The plurality of contacts 332 may be, for example, long contacts 514, gate contacts 516, or butt contacts 518 shown in FIG. 5. Long contacts 514 may connect directly from the first metal layer M1 502 to a substrate layer 520, which may contain shallow trench isolation (STI) features 522 as well as source, drain, well, and substrate features 524 in various configurations. Long contacts 514 may connect the first via layer 510 to source or drain features of transistors in the substrate layer 520. Gate contacts 516 may connect to gates 526. Although gates 526 extend into contact layer 512, they may be part of the transistor features formed in substrate layer 520. In this way, elements in the first metal layer M1 502 may be electrically connected to elements in the substrate layer 520 (e.g., the underlying semiconductor structure of FIG. 2).

In another embodiment, one or more contact features 334 are designed in a rectangular shape oriented in the second dimension 306 to function as contacting a drain/source feature to a gate. For example, the contact feature 334-1 is designed to electrically connect the gate 322 and the drain of W_PU-1; and the contact feature 334-2 is designed to electrically connect the gate 324 and the drain of the W_PU-2.

Figure 4A:
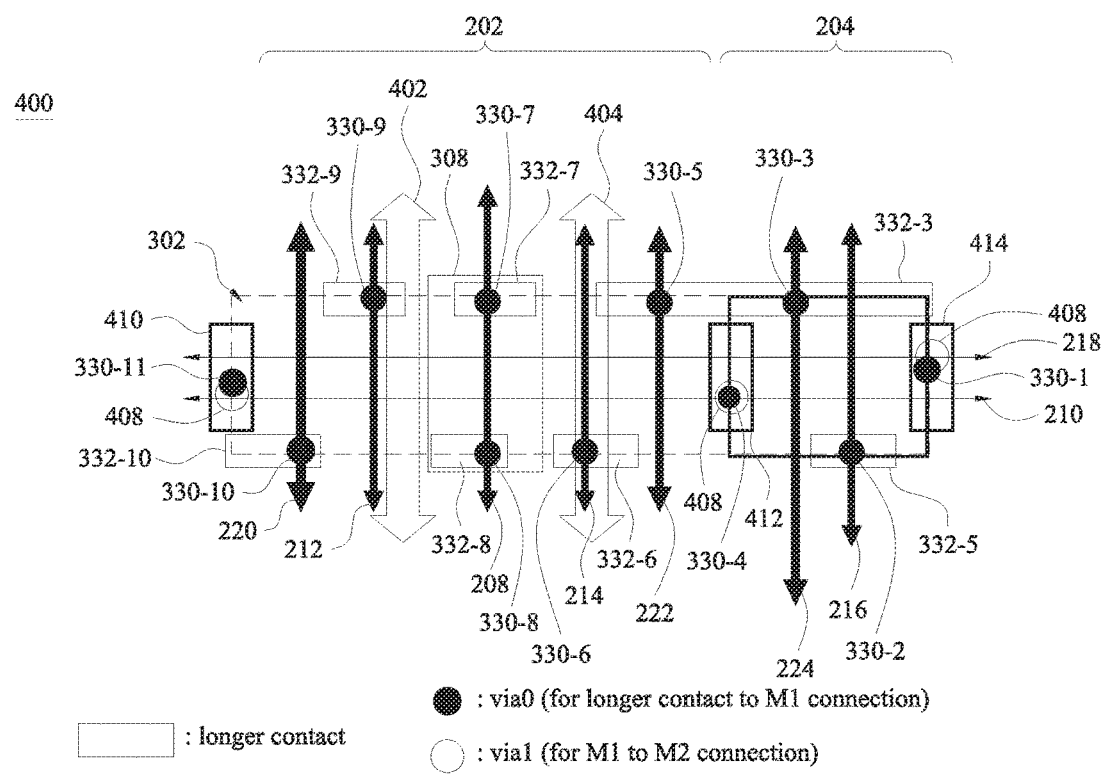
FIGS. 4A and 4B illustrate routing diagrams for metal lines overlaying a two-port SRAM cell of FIG. 2 according to embodiments of the present disclosure.

Referring to FIG. 4A, there is illustrated a routing diagram 400 for metal lines overlaying a two-port SRAM cell 200 according to an embodiment of the present disclosure. FIG. 5 will be described in conjunction with FIG. 4A, and illustrates a side view 500 of an exemplary metal layer structure, which is analogous to the metal layers structure shown in FIG. 4A but not necessarily the same metal layer structure. In the embodiment, metal lines are formed in 3 layers: a first metal layer M1 (such as metal layer M1 502 of FIG. 5), a second metal layer M2 (such as metal layer M2 504 of FIG. 5), and a third metal layer M3 (such as metal layer M3 506 of FIG. 5).

Metal lines for the positive voltage node 208, write bit line 212, inverse write bit line 214, read bit line 216, first negative voltage node 220, second negative voltage node 222, third negative voltage node 224, first write port landing pad 410, second write port landing pad 412, and read port landing pad 414 run parallel to each other, and are contained within the M1 layer. As shown in FIG. 5, first metal lines 503 may represent the metal lines in the first metal layer M1 502. In some embodiments, the metal lines are formed of copper. Alternatively, the metal lines are formed of aluminum, gold, or other proper metals.

As the negative voltage nodes 220, 222, and 224 as well as positive voltage node 208 are interdigitated between the bit lines 212, 214, and 216, it may not be possible to obtain uniform pitch between the bit lines. Accordingly, at an interface between the SRAM array area 102 and the peripheral logic area 104 of an IC 100 using the routing of FIG. 3, there may be a mismatch between bit lines 212, 214, and 216 and the corresponding bit lines of the peripheral logic area 104, which are subject to a design rule of uniform pitch.

Metal lines for the write word line 210 and the read word line 218 run parallel to each other and are contained within the M2 layer. The metal lines of the M2 layer also run perpendicular to those of the M1 layer. In some embodiments, as illustrated in FIG. 5, the M2 layer (e.g., second metal layer M2 504) is laid over the M1 layer (e.g., first metal layer M1 502). Furthermore, as shown in FIG. 5, second metal lines 505 may represent the metal lines in the second metal layer M2 504.

Metal lines for a global write bit line 402 and an inverse global write bit line 404, whose functions are further described below with respect to FIG. 8A, run parallel to each other and are contained within the M3 layer. The metal lines of the M3 layer also run perpendicular to those of the M2 layer, and parallel to those of the M1 layer. The global write bit line 402 and inverse global write bit line 404 are wider than the write bit line 212, having a width that is at least 1.2 times as large as the width of the write bit line 212 in some embodiments. Increasing the widths of the global write bit line 402 and inverse global write bit line 404 reduces the resistance of these metal lines, which is beneficial since these metal lines run the length of multiple SRAM cells 200, and reducing the resistance by widening the metal lines counteracts the increase in resistance of increasing the length of the metal line. As illustrated in FIG. 5, the M3 layer (e.g., third metal layer M3 506) is laid over the M2 layer (e.g., second metal layer M2 504). Furthermore, as shown in FIG. 5, third metal lines 507 may represent the metal lines in the third metal layer M3 506.

The routing diagram 400 overlays a semiconductor structure, shown above in FIG. 3, which implements the two-port SRAM cell 200 of FIG. 2. A plurality of first vias 330, which may correspond to the plurality of first vias 511 in a first via layer 510 of FIG. 5, provide electrical connection between the semiconductor structure and the first metal layer M1. For example, the plurality of first vias 330 may provide electrical connection between the first metal layer M1 and components in a contact layer 512 (shown in FIG. 5), including a plurality of contacts 406.

A plurality of second vias 408, which may correspond to the plurality of second vias 529 in a second via layer 528 of FIG. 5, provide electrical connection between elements in the first metal layer M1 (e.g., first metal layer M1 502 of FIG. 5) and elements in the second metal layer M2 (e.g., second metal layer M2 504 of FIG. 5). For example, two of the plurality of second vias 529 provide connection between the write word line 210, which is in the second metal layer M2, and each of the first write port landing pad 410 and the second write port landing pad 412, which are both in the first metal layer M1. Additionally, one of the plurality of second vias 529 provides connection between the read word line 218, which is in the second metal layer M2, and the read port landing pad 414, which is in the first metal layer M1.

The first plurality of vias 330 connect the first and second write port landing pads 410 and 412 as well as the read port landing pad 414 in the first metal layer M1 to the underlying semiconductor structure, and the second plurality of vias 408 connect those landing pads to the write and read word lines 210 and 218. Therefore, the word lines are connected to the underlying semiconductor structure.

Figure 4B:
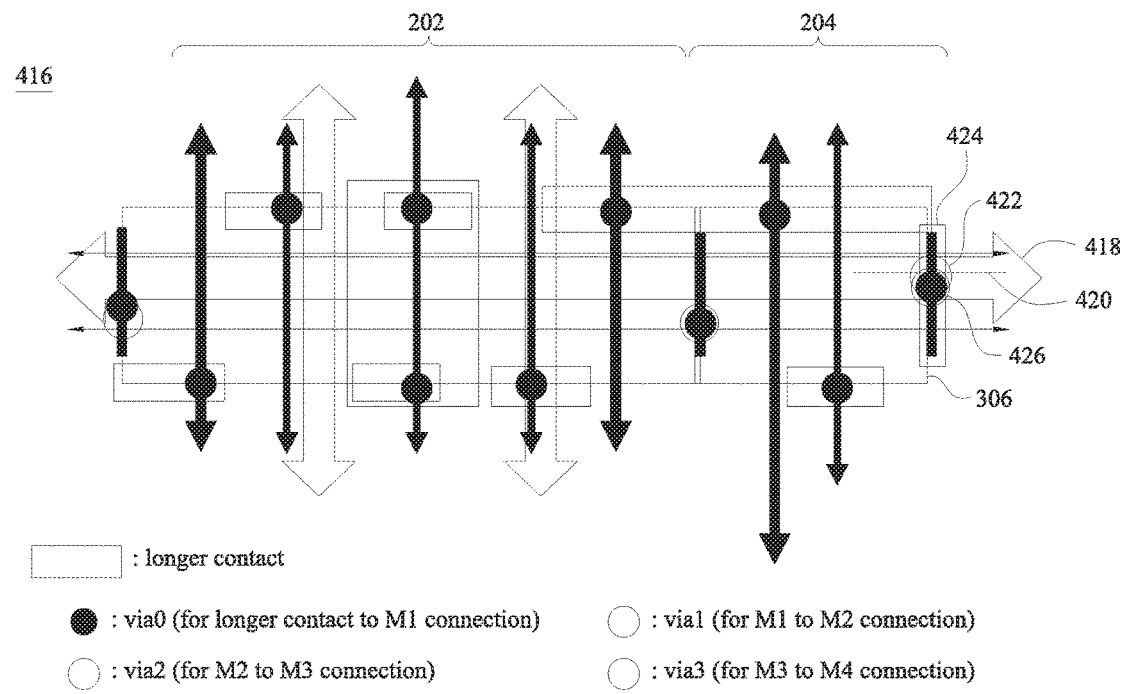

Referring now to FIG. 4B, there is illustrated a routing diagram 416 overlaying a two-port SRAM cell 200 according to an alternative embodiment of the present disclosure. In this alternative embodiment to that of FIG. 4A, all elements are substantially the same as in FIG. 3 and some differences are discussed below. FIG. 5 will be described in conjunction with FIG. 4B, and illustrates a side view 500 of an exemplary metal layer structure, which is analogous to the metal layer structure shown in FIG. 4B but not necessarily the same metal layer structure.

In the embodiment of FIG. 4B, the read word line 218 is not formed in the second metal layer M2. Instead, a wide read word line 418 is formed in a fourth metal layer M4 (such as fourth metal layer M4 508 of FIG. 5). The metal lines of the M4 layer run perpendicular to those of the M1 and M3 layers, and parallel to those of the M2 layer. The wide read word line 418 is wider than the write word line 210, having a width that is at least 1.5 times as large as the width of the write word line 210 in some embodiments. Increasing the widths of the wide read word bit line 418 reduces its resistance, which is beneficial since these metal lines run the length of multiple SRAM cells 200, and reducing the resistance by widening the metal lines counteracts the increase in resistance of increasing the length of the metal line. As illustrated in FIG. 5, the M4 layer (e.g., fourth metal layer M4 508) is laid over the M3 layer (e.g., third metal layer M3 506). Furthermore, as shown in FIG. 5, fourth metal lines 509 may represent the metal lines in the fourth metal layer M4 508.

As the read word line 218 is no longer in the M2 layer, one of the plurality of second vias 408 connects the read port landing pad 414 to an intermediate read word line landing pad 420 in the M2 layer. The intermediate read word line landing pad 420 is in turn electrically connected by one of a plurality of third vias 422, which may correspond to the plurality of third vias 531 in a third via layer 530 of FIG. 5, to an upper read word line landing pad 424 in the M3 layer. The upper read word line landing pad 424 is in turn electrically connected by one of a plurality of fourth vias 426, which may correspond to the plurality of fourth vias 533 in a fourth via layer 532 of FIG. 5, to the wide read word line 418 in the M4 layer.

Figure 6:
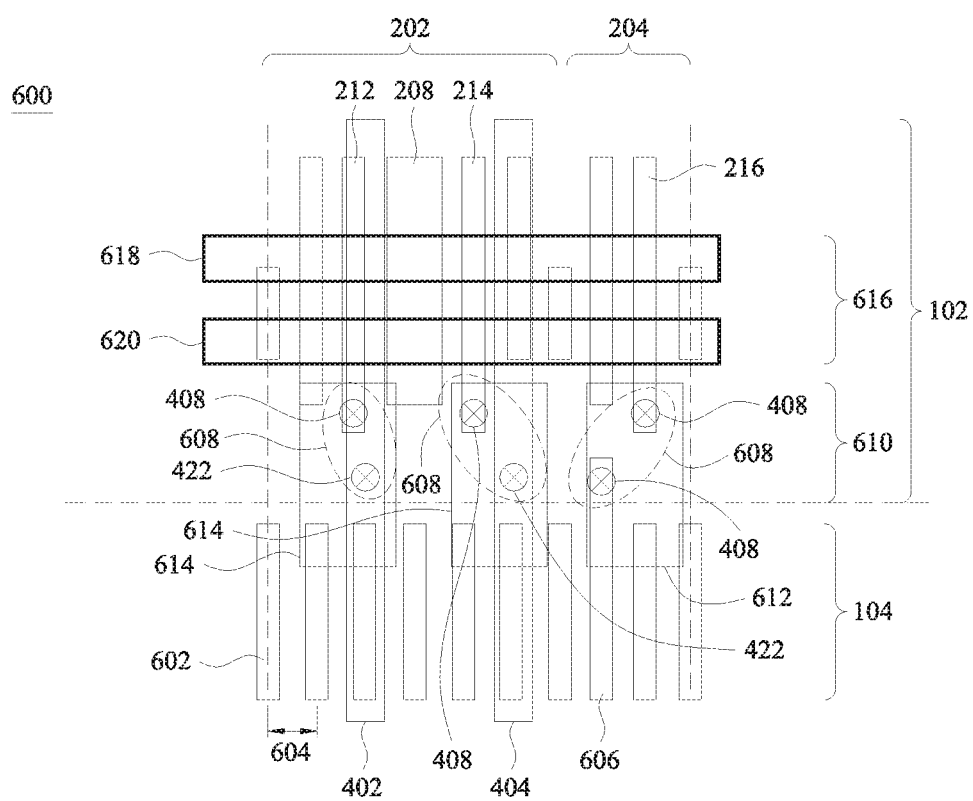
FIG. 6 illustrates a metal line structure at an interface between an SRAM cell array and peripheral logic using a jumper structure to bridge the interface in accordance with an embodiment of the present disclosure.

Referring now to FIG. 6, there is illustrated a metal line structure 600 at an interface between an SRAM cell array (e.g., an array of SRAM cells 202 and peripheral logic (e.g., peripheral logic area 104) using a jumper structure to bridge the interface in accordance with an embodiment of the present disclosure. In some embodiments, modern lithography process nodes may be used in manufacturing the peripheral logic area 104, resulting in design rules that require that metal lines in the peripheral logic area 104 be formed only in one dimension and with uniform pitch between each element. For example, in advanced process nodes, spacers may be formed over pre-patterned mandrels to obtain small line widths. The use of mandrels may limit spacer formation to one dimension, and accordingly metal lines formed using the spacers are limited to one dimension.

The peripheral logic area 104 contains metal lines 602 with a uniform pitch 604. The metal lines 602 in this embodiment are in the first metal layer M1 (e.g., first metal layer M1 502 of FIG. 5). The metal lines 602 contain a peripheral read bit line 606. A global write bit line 402 and an inverse global write bit line 404 in a third metal layer M3 (e.g., third metal layer M3 506 of FIG. 5) overlay the metal lines 602 in the first metal layer M1.

SRAM array area 102 contains write bit line 212 and inverse write bit line 214 as well as read bit line 216. There may be misalignment between bit lines of the SRAM array area 102 and bit lines of the peripheral logic area 104 at interfaces 608 between the SRAM array area 102 and the peripheral logic area 104. For example, the read bit line 216 and a corresponding read bit line 606 in the logic area 104 extend in two parallel tracks, but are misaligned.

In order to remedy the misalignments at interfaces 608, a jumper structure 610 is formed in the second metal layer M2 (e.g., the second metal layer M2 504 of FIG. 5) over the interfaces 608 to provide electrical connection between the misaligned bit lines of the SRAM array area 102 and the peripheral logic area 104. The jumper structure 610 includes a plurality of jumpers 612 and 614. In this embodiment, each jumper 612 and 614 is a metal line having a width that is more than twice the pitch 604 of peripheral logic area 104. The width is in a direction perpendicular to the direction that the bit lines of the SRAM array area 102 and peripheral logic area 104 of the M1 layer run in, such that the width spans across at least two of the bit lines of the M1 layer. This width ensures that even if the bit lines of the peripheral logic area 104 are misaligned with the bit lines of the SRAM array area 102 and the global bit lines as much as possible, the jumper 610 will still overlap with the target metal lines that it is intended to bridge between.

Each jumper 612 and 614 also has a length that is longer than its width, the length running in the same direction as the bit lines of the SRAM array area 102 and peripheral logic area 104. This allows the jumpers 612 and 614 to bridge the distance between the peripheral logic area 104 and the SRAM array area 102 at the interfaces 608. Furthermore, the length direction of the jumpers 612 and 614 runs perpendicular to other lines in the M2 layer, including the well strap lines 618 and 620 and the word lines 210 and 218.

First jumper 612 bridges between peripheral read bit line 606 of peripheral logic area 104 and read bit line 216 of SRAM array area 102. Both of the target bit lines are in the first metal layer M1 in this case. A second via 408 is formed to bridge between the peripheral read bit line 606 of peripheral logic area 104 in the first metal layer M1 and the jumper 612 in the second metal layer M2. Another second via 408 is formed to bridge between the jumper 612 in the second metal layer M2 and the read bit line 216 of the SRAM array area 102 in the first metal layer M1. In this manner, the misaligned read bit lines 606 and 216 are electrically connected across interface 608 while adhering to design rules that only allow metal lines 602 in the peripheral logic area 104 to be formed in one dimension and with uniform pitch 604 between metal lines 602.

Furthermore, second jumpers 614 of jumper structure 610 in the second metal layer M2 may be used to form an electrical connection between metal lines in the first metal layer M1, such as write bit line 212 and inverse write bit line 214, and metal lines in the third metal layer M3, such as global write bit line 402 and inverse global write bit line 404. Second jumpers 614 may be of a similar width to first jumpers 612, which allows misalignment between the target metal lines in the M1 and M3 layers. Such a misalignment may occur, for example, because the global bit lines are wider than the bit lines of the SRAM array area 102 in order to reduce the resistance of the global bit lines to account for their longer path. This increased width of the global bit lines, in conjunction with the interdigitation of metal lines for the positive and negative power nodes in the SRAM array area 102 (e.g., positive power node 208) with the bit lines of the SRAM array area 102, may prevent the global bit lines from sharing a pitch with the bit lines of the SRAM array area 102.

In an embodiment, one second jumper 614 bridges between global write bit line 402 and write bit line 212 of SRAM array area 102. Write bit line 212 is in first metal layer M1, and global write bit line 402 is in third metal layer M3 (e.g., third metal layer M3 506 of FIG. 5). A third via 422 is formed to bridge between the global write bit line 402 in third metal layer M3 and the jumper 614 in the second metal layer M2. A second via 408 is formed to bridge between the jumper 614 in the second metal layer M2 and the write bit line 212 of the SRAM array area 102 in the first metal layer M1. In a similar manner, another second jumper 614 bridges between inverse global write bit line 404 in the third metal layer M3 and inverse write bit line 214 of SRAM array area 102 in the first metal layer M1. In this manner, the misaligned write bit line 212 and global write bit line 402 are electrically connected, and the misaligned inverse write bit line 214 and inverse global write bit line 404 are electrically connected.

In some embodiments, there may additionally be a well strap cell 616 between the jumper structure 610 and the SRAM array area 102. Well strap cells 616 provide connections between the N-wells 308 and P-wells 310 of two-port SRAM cells 200 to supply bulk terminal voltages as needed. N-well strap line 618 may be used for coupling the N-wells 308, for example, to a positive voltage line outside the array such as a periphery positive voltage line. The P-well strap line 620 may be coupled to the P-wells 310 and to a negative voltage line. This allows the N-wells 308 to be electrically isolated from the positive voltage node 208 of the two-port SRAM cell 200. The N-well strap line 618 and the P-well strap line 620 may be formed in the second metal layer M2 and run perpendicular to the jumpers 612 and 614 of jumper structure 610 (also formed in the M2 layer), as the jumpers 612 and 614 of structure 610 need not span out of the jumper structure 610.

Figure 7A:
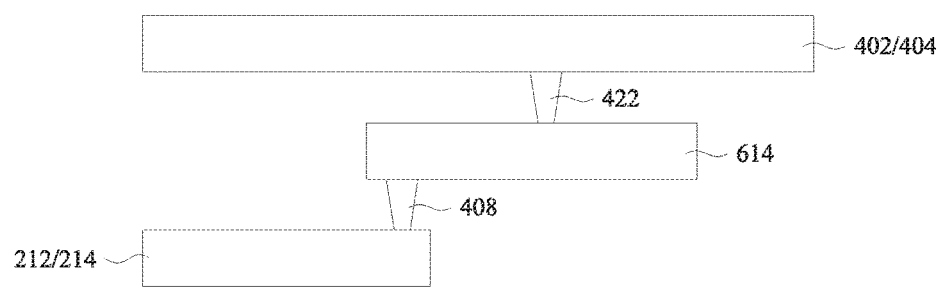
FIGS. 7A and 7B illustrate side views of jumpers from the jumper structure of FIG. 6.

Referring now to FIG. 7A, there is illustrated a side view of the jumper 614 to clearly illustrate the connections formed from the first metal layer M1 to the third metal layer M3 in FIG. 6 in accordance with an embodiment of the present disclosure. One of write bit line 212 or 214 is illustrated in the first metal layer M1, which is at the bottom of the metal layer stack. A second via 408 connects write bit line 212 or 214 to the jumper 614, which is a metal landing pad in the second metal layer M2. A third via 422 connects the jumper 614 to one of the global write bit lines 402 or 404, which are located in the third metal layer M3.

As discussed above, the global write bit lines 402 and 404, the vias 408 and 422, and the jumper 614 may be formed of copper. Alternatively, they may be formed of aluminum, gold, or another proper metal. The global write bit lines 402 and 404, the vias 408 and 422, and the jumper 614 may be formed by a dual-damascene process in an embodiment. In another embodiment, they may be formed by a single-damascene process. In some embodiments, second via 408 and jumper 614 may be formed in one process. For example, the first dielectric layer (e.g., first via layer 510) may be formed, the second dielectric layer (e.g., second metal layer M2 504) may be formed over the first dielectric layer, a hole may be patterned into both the first and the second dielectric layer, a trench may be patterned into the second dielectric layer, and copper may be deposited into the trench and the hole to form the second via 408 and jumper 614. A chemical mechanical polishing (CMP) process may be performed to remove excess copper after deposition. Likewise, third via 422 and global write bit line 402 or 404 may be formed in one deposition process followed by a CMP process.

Figure 7B:
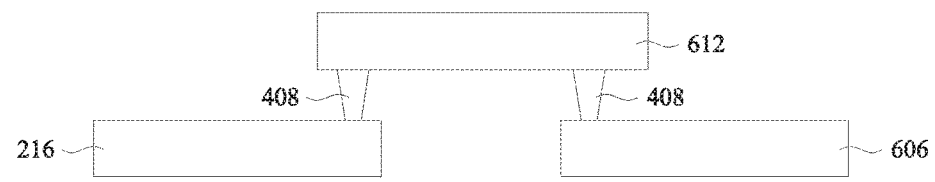

Referring now to FIG. 7B, there is illustrated a side view of the jumper 612 to clearly illustrate the connections formed from one feature in the first metal layer M1 to another feature in the first metal layer M1 in FIG. 6 in accordance with an embodiment of the present disclosure. The read bit line 216 is illustrated in the SRAM array area 102 of the first metal layer M1, which is at the bottom of the metal layer stack. A second via 408 connects read bit line 216 to the jumper 612, which is a metal landing pad in the second metal layer M2. Another second via 408 connects the jumper 612 to the peripheral read bit line 606, which is located in the peripheral logic area 104 of the first metal layer M1.

The read bit line 216, the vias 408, and the jumper 612 may be formed as discussed above with respect to jumper 614 and second via 408. E.g., they may be formed of copper in one deposition step using a dual-damascene process followed by a CMP process, in one embodiment.

FIGS. 8A-10B illustrate various alternative embodiments of SRAM cell arrays employing the jumper structure 610 of FIG. 6 to create arrays of two-port SRAM cells 200.

Figure 8A:
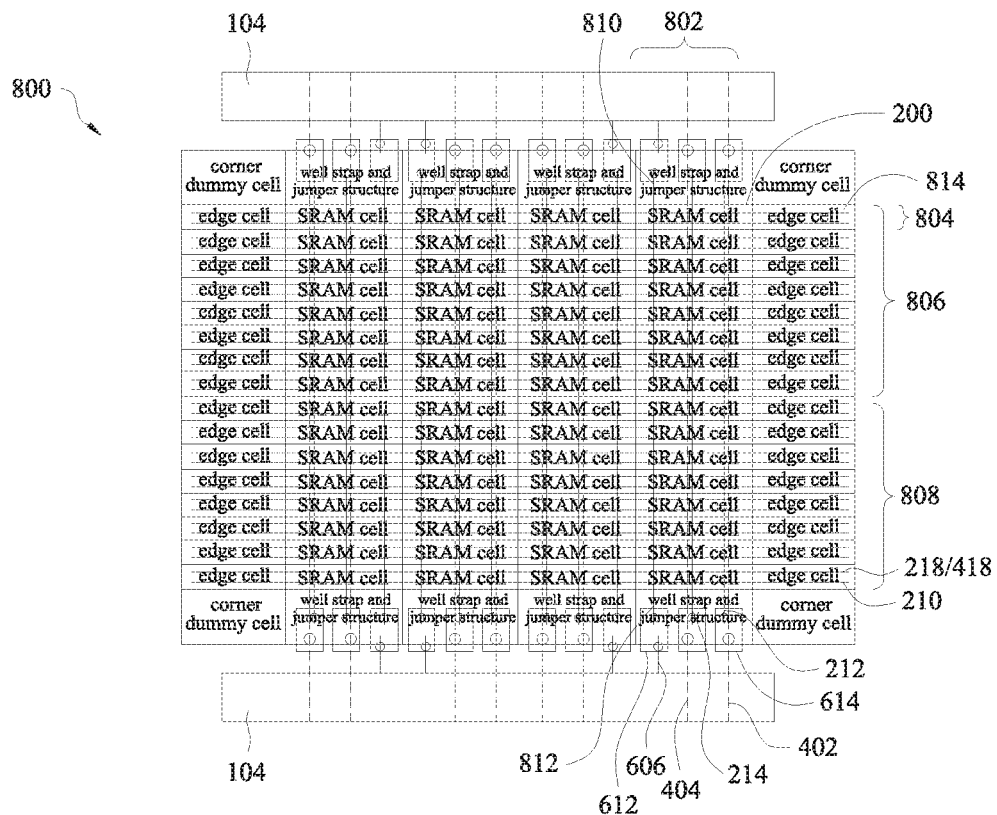

Referring now to FIG. 8A, there is illustrated a block diagram of an SRAM cell array 800 according to an embodiment of the present disclosure. The SRAM cell array 800 includes a plurality of two-port SRAM cells 200. In the present embodiment, there are 64 two-port SRAM cells 200 in the SRAM cell array 800, which may be called an SRAM block. The SRAM block is grouped into 4 columns 802 and 16 rows 804. Each column 802 includes 16 two-port SRAM cells 200, while each row 804 includes 4 two-port SRAM cells 200. In some embodiments, the two-port SRAM cells 200 may be implemented as described above in one of FIGS. 3-5. The SRAM cell array 800 is divided into a top sub array 806 and a bottom sub array 808. Each sub array has 8 rows 804 and 4 columns 802, and therefore contains 32 two-port SRAM cells 200.

Each column 802 is served by a write bit line 212, an inverse write bit line 214, a global write bit line 402, and an inverse global write bit line 404. Furthermore, the top sub array 806 is served by a top read bit line 810 and the bottom sub array 808 is served by a bottom read bit line 812. The top read bit line 810 and bottom read bit line 812 are electrically isolated from each other. In some embodiments, each column 802 is a mirror image of the column on each side of itself. At the end of each column 802 there may be a jumper structure 610 that connects the two-port SRAM cells 200 of the column 802 to peripheral logic in logic area 104. In the illustrated embodiment, there is peripheral logic on both the top and bottom sides of the SRAM cell array 800, however it is understood that in other embodiments there may be peripheral logic on only one side of the array.

In this embodiment, the global write bit lines 402 and 404 only connect to the array 800 at the jumper structure 610, while local write bit lines 212 and 214 connect from the jumper structure to each two-port SRAM cell 200 of a given column 802. The global write bit lines 402 and 404 may in turn extend over the peripheral logic in logic area 104 to relay signals to the write bit lines of column 802. In this configuration, information from outside the array 800 can be relayed to each cell 200 in the column 802.

Each row 804 is served by a write word line 210 and a read word line 218 or 418, as described above. The write word line 210 and the read word lines 218 or 418 may in some embodiments extend beyond the array 800. In this embodiment, the write and read word lines 210 and 218 or 418 connect to each cell 200 in a row 804. Furthermore, edge cells 814 may border the SRAM cell array 800 such that the word lines 210 and 218 or 418 run over the edge cells 814. In some embodiments, edge cells 814 may provide connections to the word lines 210 and 218 or 418, and which may include driver circuitry for the word lines.

In combination, the read and write bit lines of a row 804 may be supplied with data to select a row 804 of two-port SRAM cells 200 while the read or write lines of a column 802 may turned on to select one two-port SRAM cell 200 to read or write to.

Figure 8B:
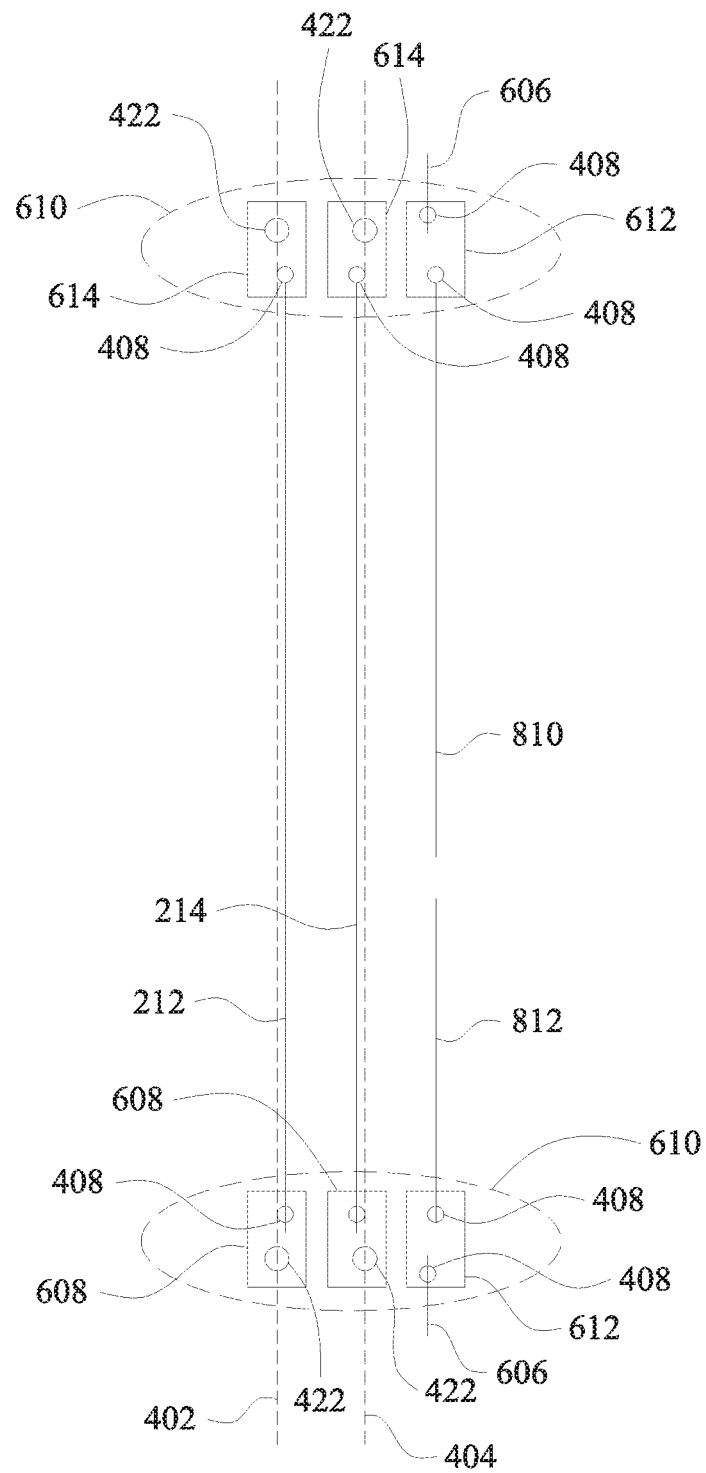
FIGS. 8B, 9B, 10B, 11B, 12B, and 13B illustrate read and write lines of FIGS. 8A, 9A, 10A, 11A, 12A, and 13A without the underlying features of the SRAM array.

Referring now to FIG. 8B, the columnar set of metal lines overlaying SRAM cell array 800 is shown without the underlying SRAM array 800 for clarity. The columnar set of metal lines includes write bit line 212, inverse write bit line 214, and top and bottom read bit lines 810 and 812. In this view, the jumper structure 610 including vias 408 and 422, connected as described above with respect to FIGS. 6 and 7, is more visible.

Figure 9A:
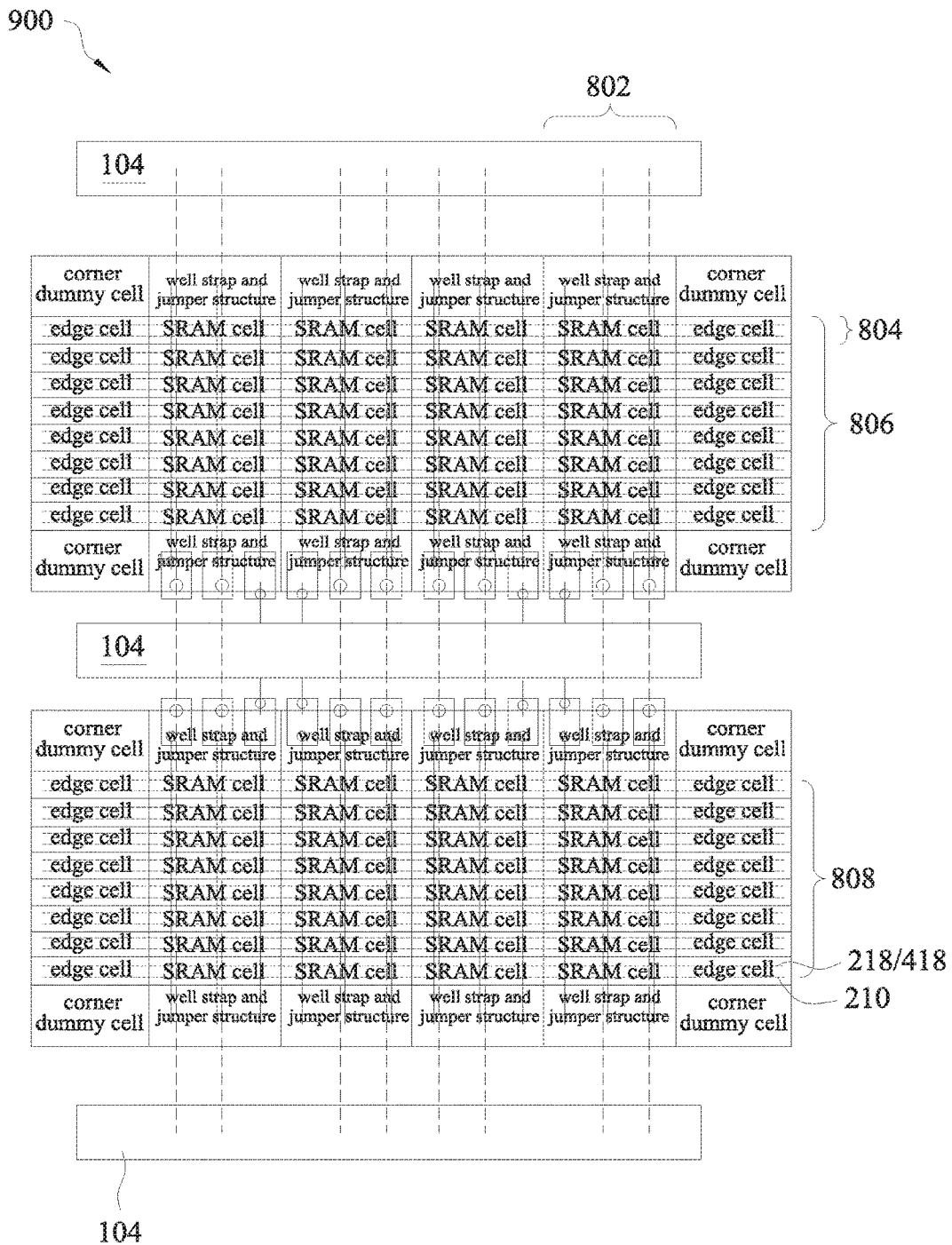

Referring now to FIG. 9A, there is illustrated a block diagram of an SRAM cell array 900 according to an embodiment of the present disclosure. The SRAM cell array 900 includes a plurality of two-port SRAM cells 200. As in FIG. 8A, there are 64 two-port SRAM cells 200 in the SRAM cell array 900, however they are divided into two physically isolated 32 cell blocks. The SRAM blocks are grouped into 4 columns 802 and 8 rows 804 each. Each column 802 includes 8 two-port SRAM cells 200, while each row 804 includes 4 two-port SRAM cells 200. In some embodiments, the two-port SRAM cells 200 may be implemented as described above in one of FIGS. 3-5.

SRAM cell array 900 is substantially similar to SRAM cell array 800, except that the top sub array 806 of SRAM cell array 900 is separated from the bottom sub array 808 by a block of peripheral logic in peripheral logic area 104. Each sub array 806 and 808 has 8 rows 804 and 4 columns 802, and therefore contains 32 two-port SRAM cells 200.

As a logic area 104 separates the top sub array 806 from the bottom sub array 808, each sub array 806 and 808 has its own write bit line, inverse write bit line, and read bit line. Top sub array 806 has a top write bit line 902, a top inverse write bit line 904, and a top read bit line 810. Bottom sub array 808 has a bottom write bit line 906, a bottom inverse write bit line 908, and a bottom read bit line 812. The global write bit line 402 and inverse global write bit line 404 serve both sub arrays 806 and 808. The top read bit line 810, top write bit line 902, and top inverse write bit line 904 are electrically isolated from the bottom read bit line 812, the bottom write bit line 906, and the bottom inverse write bit line 908. In some embodiments, top write bit line 902 functions similarly to bottom write bit line 906, and both function similarly to write bit line 212. Furthermore, top inverse write bit line 904 functions similarly to bottom inverse write bit line 908, and both function similarly to inverse write bit line 214.

In some embodiments, each column 802 is a mirror image of the column on each side of itself. At the end of each column 802 there may be a jumper structure 610 that connects the two-port SRAM cells 200 of the column 802 to peripheral logic in logic area 104. In the illustrated embodiment, there is peripheral logic between the top and bottom SRAM cell sub arrays 806 and 808, as well as on the outer sides of top and bottom SRAM cell sub arrays 806 and 808, however it is understood that in other embodiments there may be peripheral logic on only one side of the array.

Each row 804 is served by a write word line 210 and a read word line 218 or 418, similar to the rows 804 of SRAM cell array 800 of FIG. 8A.

Figure 9B:
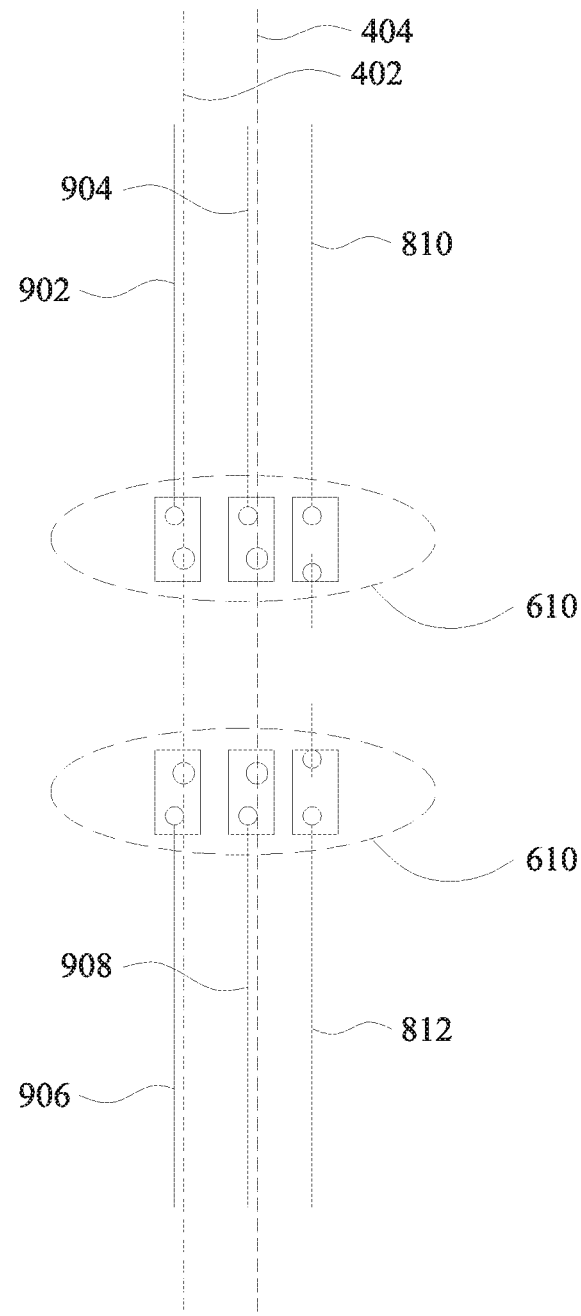

Referring now to FIG. 9B, the columnar set of metal lines overlaying SRAM cell array 900 is shown without the underlying SRAM array 900 for clarity. In some embodiments, the set of metal lines is substantially similar to that shown in FIG. 8B, except as described below. The columnar set of metal lines includes top write bit line 902, top inverse write bit line 904, top read bit line 810, bottom write bit line 906, bottom inverse write bit line 908, and bottom read bit line 812. In this view, the jumper structure 610 including vias 408 and 422, connected as described above with respect to FIGS. 6 and 7, is more visible.

Figure 10A:
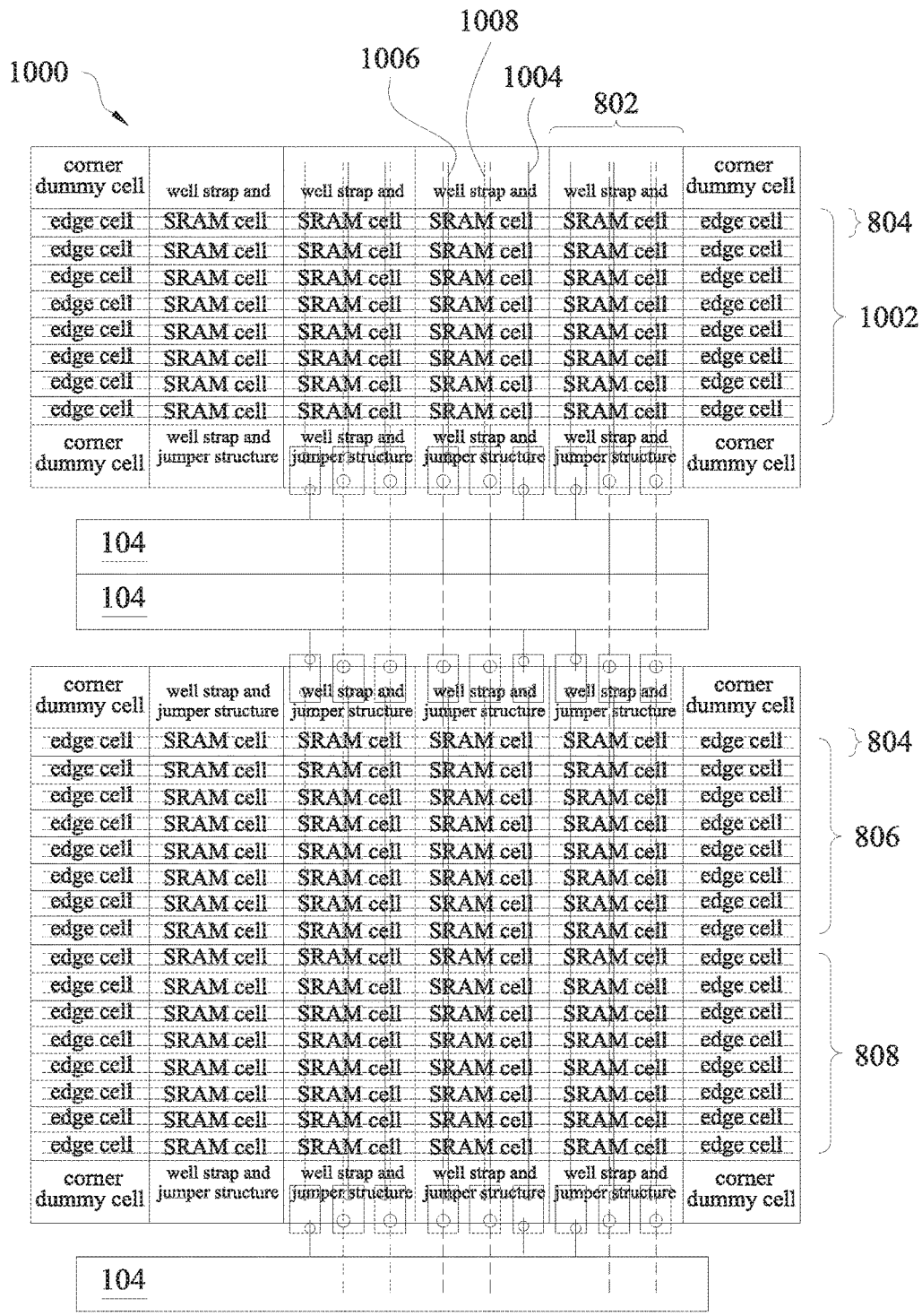

Referring now to FIG. 10A, there is illustrated a block diagram of an SRAM cell array 1000 according to an embodiment of the present disclosure. The SRAM cell array 1000 includes a plurality of two-port SRAM cells 200. In addition to the 64 two-port SRAM cells 200 shown in FIGS. 8A and 9A, there are 32 more two-port SRAM cells 200 in SRAM cell array 1000, for a total of 96 two-port SRAM cells 200. However, they are divided into one 32 cell block and one 64 cell block. The 32 cell block includes SRAM cells that are grouped into 4 columns 802 and 8 rows 804. The 64 cell block includes SRAM cells that are grouped into 4 columns and 16 rows 804. Each column 802 includes 24 two-port SRAM cells 200, while each row 804 includes 4 two-port SRAM cells 200. In some embodiments, the two-port SRAM cells 200 may be implemented as described above in one of FIGS. 3-5.

SRAM cell array 1000 is substantially similar to SRAM cell array 900, except that there is a third sub array 1002, which similar to top sub array 806 of SRAM cell array 900 is separated from the other two sub arrays 806 and 808 by a block of peripheral logic in peripheral logic area 104. Each sub array 1002, 802, and 904 has 8 rows 804 and 4 columns 802, and therefore contains 32 two-port SRAM cells 200.

As a logic area 104 separates the third sub array 1002 from the bottom sub arrays 806 and 808, third sub array 1002 has its own third sub array write bit line 1006, third sub array inverse write bit line 1008, and third sub array read bit line 1004. Top sub array 806 shares write bit line 212 and inverse write bit line 214 with bottom sub array 808. However, top sub array 806 has its own top read bit line 810 while bottom sub array 808 has its own bottom read bit line 812. The global write bit line 402 and inverse global write bit line 404 serve sub arrays 806, 808, and 1002. The top read bit line 810 and bottom read bit line 812 are electrically isolated from each other. In some embodiments, the third sub array read bit line 1004 may function similarly to the top or bottom read bit lines 910 or 912, the third sub array write bit line 1006 may function similarly to the write bit line 212, and the third sub array inverse write bit line 1008 may function similarly to the inverse write bit line 214.

In some embodiments, each column 802 is a mirror image of the column on each side of itself. Where each column 802 meets the edge of an SRAM cell block, there may be a jumper structure 610 that connects the two-port SRAM cells 200 of one SRAM cell block to peripheral logic in logic area 104. In the illustrated embodiment, there is peripheral logic between the third and top SRAM cell sub arrays 1002 and 806, as well as on the outer sides of third and bottom SRAM cell sub arrays 1002 and 808, however it is understood that in other embodiments there may be peripheral logic on only one side of the array.

Each row 804 is served by a write word line 210 and a read word line 218 or 418, similar to the rows 804 of SRAM cell array 800 of FIG. 8A.

Figure 10B:
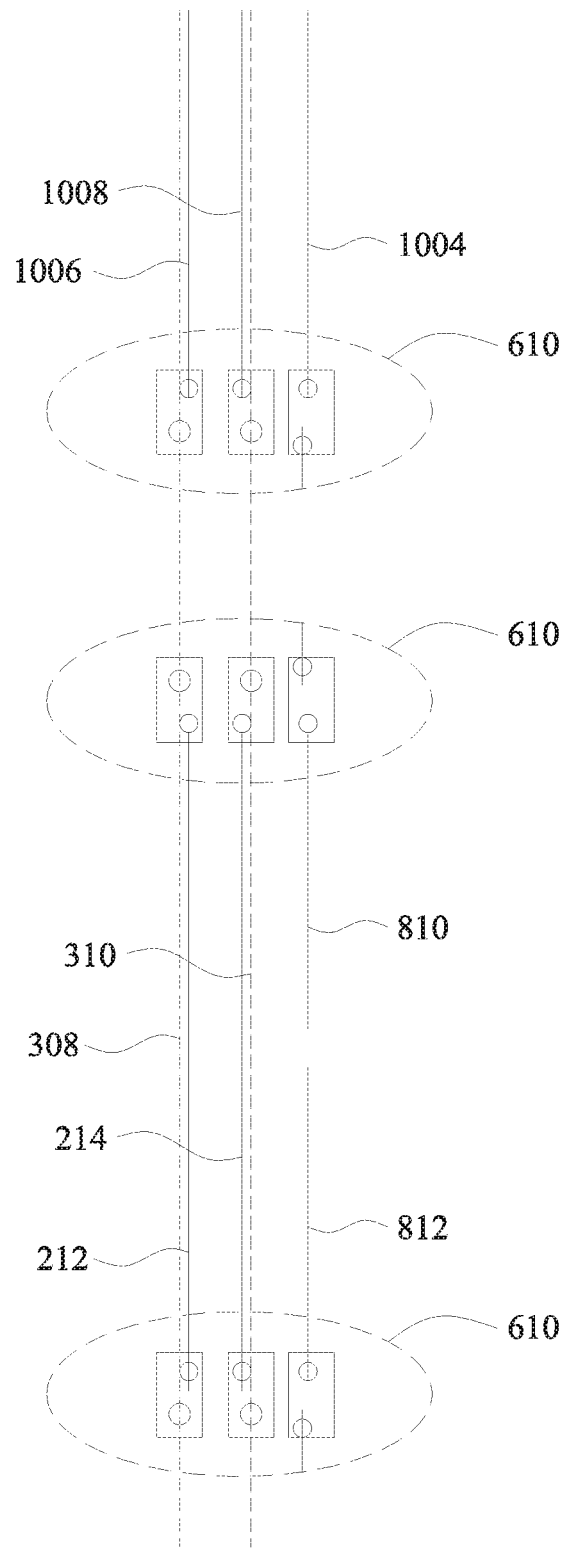

Referring now to FIG. 10B, the columnar set of metal lines overlaying SRAM cell array 1000 is shown without the underlying SRAM array 1000 for clarity. In some embodiments, the set of metal lines is substantially similar to that shown in FIG. 8B, except as described below. The columnar set of metal lines includes third sub array read bit line 1004, third sub array write bit line 1006, third sub array inverse write bit line 1008, top read bit line 810, and bottom read bit line 812. In this view, the jumper structure 610 including vias 408 and 422, connected as described above with respect to FIGS. 6 and 7, is more visible.

FIGS. 11A-13B illustrate various alternative embodiments employing the jumper structure 610 of FIG. 6 to create arrays of two-port SRAM cells 200 with a global read bit line.

Figure 11A:
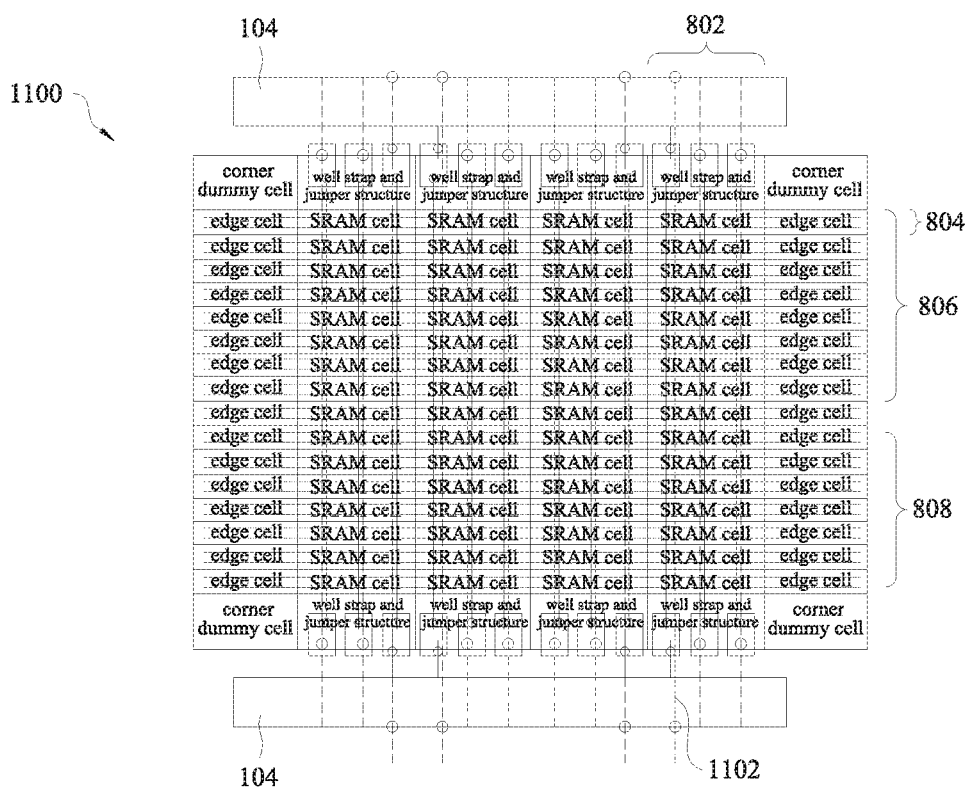

Referring now to FIG. 11A, there is illustrated a block diagram of an SRAM cell array 1100 according to an embodiment of the present disclosure. The SRAM cell array 1100 includes a plurality of two-port SRAM cells 200. As in FIG. 8A, there are 64 two-port SRAM cells 200 in the SRAM cell array 1100, which may be called an SRAM block. The SRAM block is grouped into 4 columns 802 and 16 rows 804. Each column 802 includes 16 two-port SRAM cells 200, while each row 804 includes 4 two-port SRAM cells 200. In some embodiments, the two-port SRAM cells 200 may be implemented as described above in one of FIGS. 3-5.

SRAM cell array 1100 is substantially similar to SRAM cell array 800, except that there is additionally a global read bit line 1102 servicing each column 802. Each column 802 is also serviced by a write bit line 212, an inverse write bit line 214, a global write bit line 402, and an inverse global write bit line 404, a top read bit line 810 connected only to two-port SRAM cells 200 in the top sub array 806, and a bottom read bit line 812 connected only to two-port SRAM cells 200 in the bottom sub array 808. The top read bit line 810 and bottom read bit line 812 are electrically isolated from each other. In some embodiments, each column 802 is a mirror image of the column on each side of itself. At the end of each column 802 there may be a jumper structure 610 that connects the two-port SRAM cells 200 of the column 802 to peripheral logic in logic area 104.

In the illustrated embodiment, there is peripheral logic on each side of the SRAM cell array 1100, however it is understood that in other embodiments there may be peripheral logic on only one side of the array. The global read bit line 1102 is not directly electrically connected to the SRAM cell array 1100. Instead, it is connected to an input node of a sense amplifier (SA) in the peripheral logic, and an output node of the sense amplifier is in turn electrically connected to the top read bit line 810 or the bottom read bit line 812, depending on which side of the SRAM cell array 1100 it is on. In some embodiments, the sense amplifier may be an inverter based sense amplifier.

Each row 804 is served by a write word line 210 and a read word line 218 or 418, similar to the rows 804 of SRAM cell array 900 of FIG. 8A.

Figure 11B:
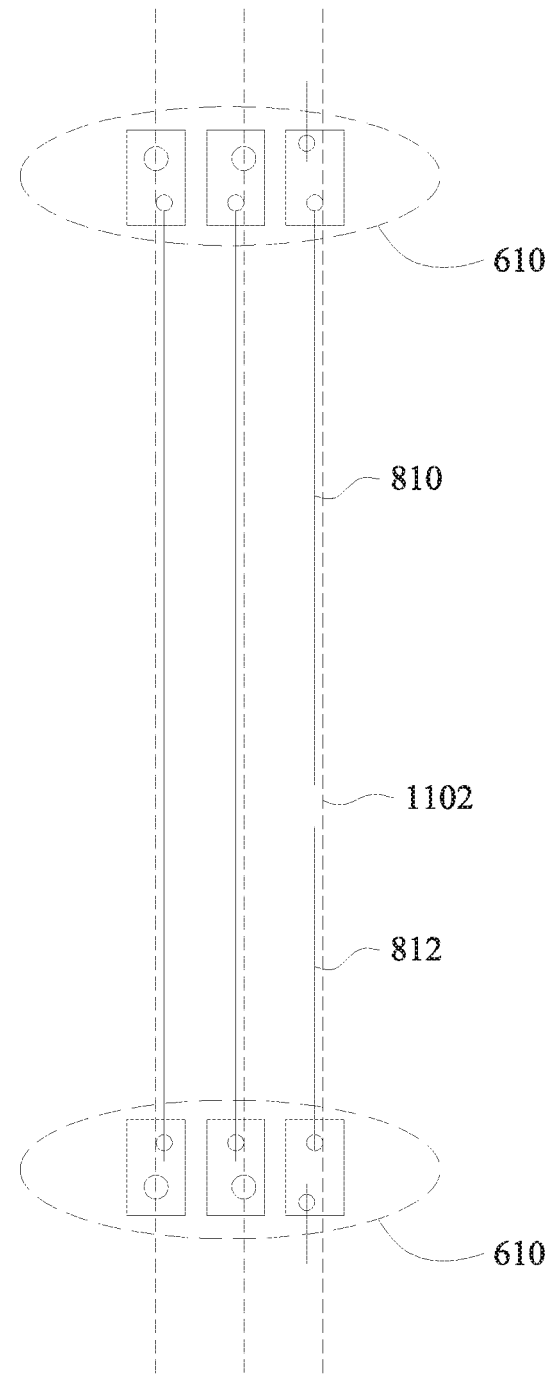

Referring now to FIG. 11B, the columnar set of metal lines overlaying SRAM cell array 1100 is shown without the underlying SRAM array 1100 for clarity. In some embodiments, the set of metal lines is substantially similar to that shown in FIG. 8B, except as described below. The columnar set of metal lines includes top read bit line 810, bottom read bit line 812, and global read bit line 1102. In this view, the jumper structure 610 including vias 324 and 316, connected as described above with respect to FIGS. 6 and 7, is more visible.

Figure 12A:
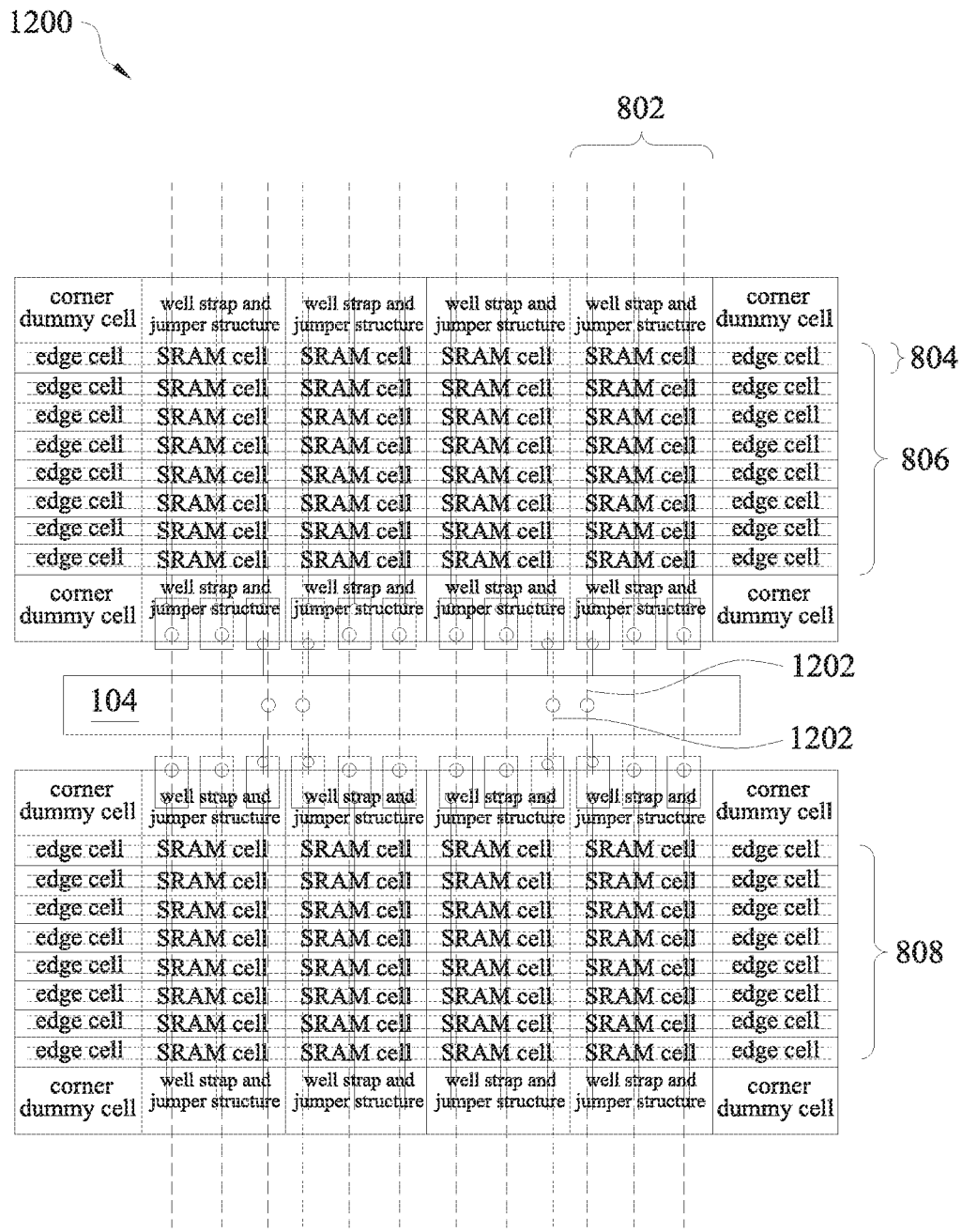

Referring now to FIG. 12A, there is illustrated a block diagram of an SRAM cell array 1200 according to an embodiment of the present disclosure. The SRAM cell array 1200 includes a plurality of two-port SRAM cells 200. As in FIG. 9A, there are 64 two-port SRAM cells 200 in the SRAM cell array 1200, divided into two 32 cell blocks. The SRAM blocks are grouped into 4 columns 802 and 8 rows 804 each. Each column 802 includes 8 two-port SRAM cells 200, while each row 804 includes 4 two-port SRAM cells 200. In some embodiments, the two-port SRAM cells 200 may be implemented as described above in one of FIGS. 3-5.

SRAM cell array 1200 is substantially similar to SRAM cell array 900 in that the top sub array 806 of SRAM cell array 1200 is separated from the bottom sub array 808 by a block of peripheral logic in peripheral logic area 104. Each sub array 806 and 8080 has 8 rows 804 and 4 columns 802, and therefore contains 32 two-port SRAM cells 200. Differences between SRAM cell array 1200 and SRAM cell array 900 are described below.

As a logic area 104 separates the top sub array 806 from the bottom sub array 808, each subarray 806 and 808 has its own write bit line, inverse write bit line, and read bit line. Top sub array 806 has a top write bit line 902, a top inverse write bit line 904, and a top read bit line 810. Bottom sub array 808 has a bottom write bit line 906, a bottom inverse write bit line 908, and a bottom read bit line 812. The top read bit line 810, top write bit line 902, and top inverse write bit line 904 are electrically isolated from the bottom read bit line 812, bottom write bit line 906, and bottom inverse write bit line 908. In some embodiments, top write bit line 902 functions similarly to bottom write bit line 906, and both function similarly to write bit line 212. Furthermore, top inverse write bit line 904 functions similarly to bottom inverse write bit line 908, and both function similarly to inverse write bit line 214.

The global write bit line 402 and inverse global write bit line 404 serve both sub arrays 806 and 808. Furthermore, as in FIG. 11A, global read bit line 1102 serves both sub arrays 806 and 808. In some embodiments, each column 802 is a mirror image of the column on each side of itself. At the end of each column 802 there may be a jumper structure 610 that connects the two-port SRAM cells 200 of the column 802 to peripheral logic in logic area 104.

In the illustrated embodiment, there is peripheral logic between the top and bottom SRAM cell sub arrays 806 and 808, however it is understood that in other embodiments there may be peripheral logic on only one side of the array or on the outer sides of top and bottom SRAM cell sub arrays 806 and 808. The global read bit line 1102 is not directly electrically connected to the SRAM cell array 1200. Instead, it is connected to an input node of a sense amplifier (SA) in the peripheral logic, and an output node of the sense amplifier is in turn electrically connected to the top read bit line 810 and bottom read bit line 812.

Each row 804 is served by a write word line 210 and a read word line 218 or 418, similar to the rows 804 of SRAM cell array 800 of FIG. 8A.

Figure 12B:
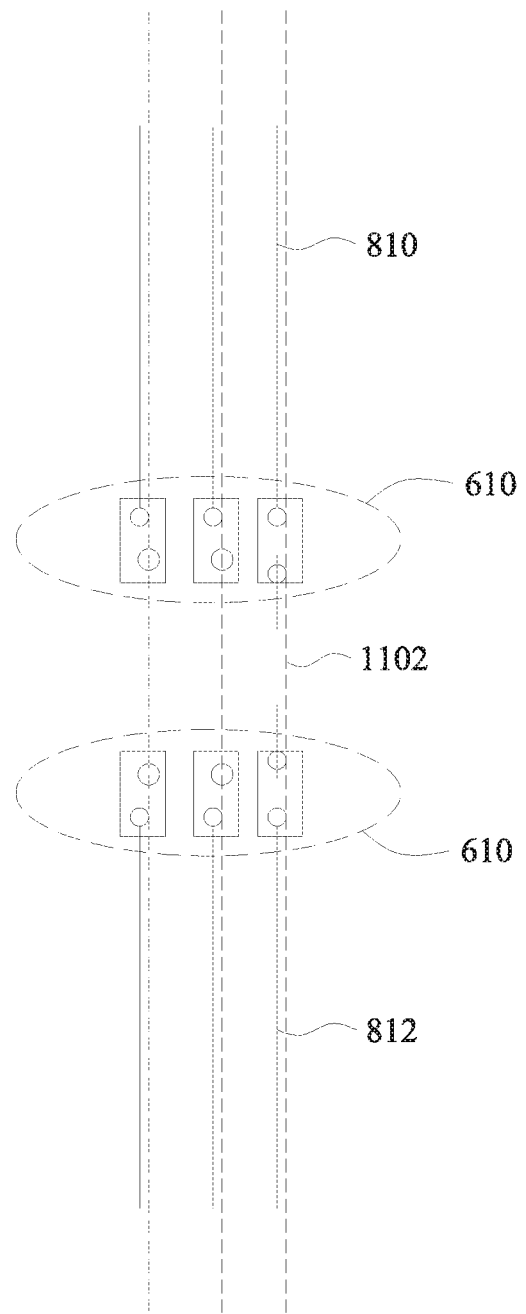

Referring now to FIG. 12B, the columnar set of metal lines overlaying SRAM cell array 1200 is shown without the underlying SRAM array 1200 for clarity. In some embodiments, the set of metal lines is substantially similar to that shown in FIG. 9B, except as described below. The columnar set of metal lines includes top read bit line 810, bottom read bit line 812, and global read bit line 1102. In this view, the jumper structure 610 including vias 408 and 422, connected as described above with respect to FIGS. 6 and 7, is more visible.

Figure 13A:
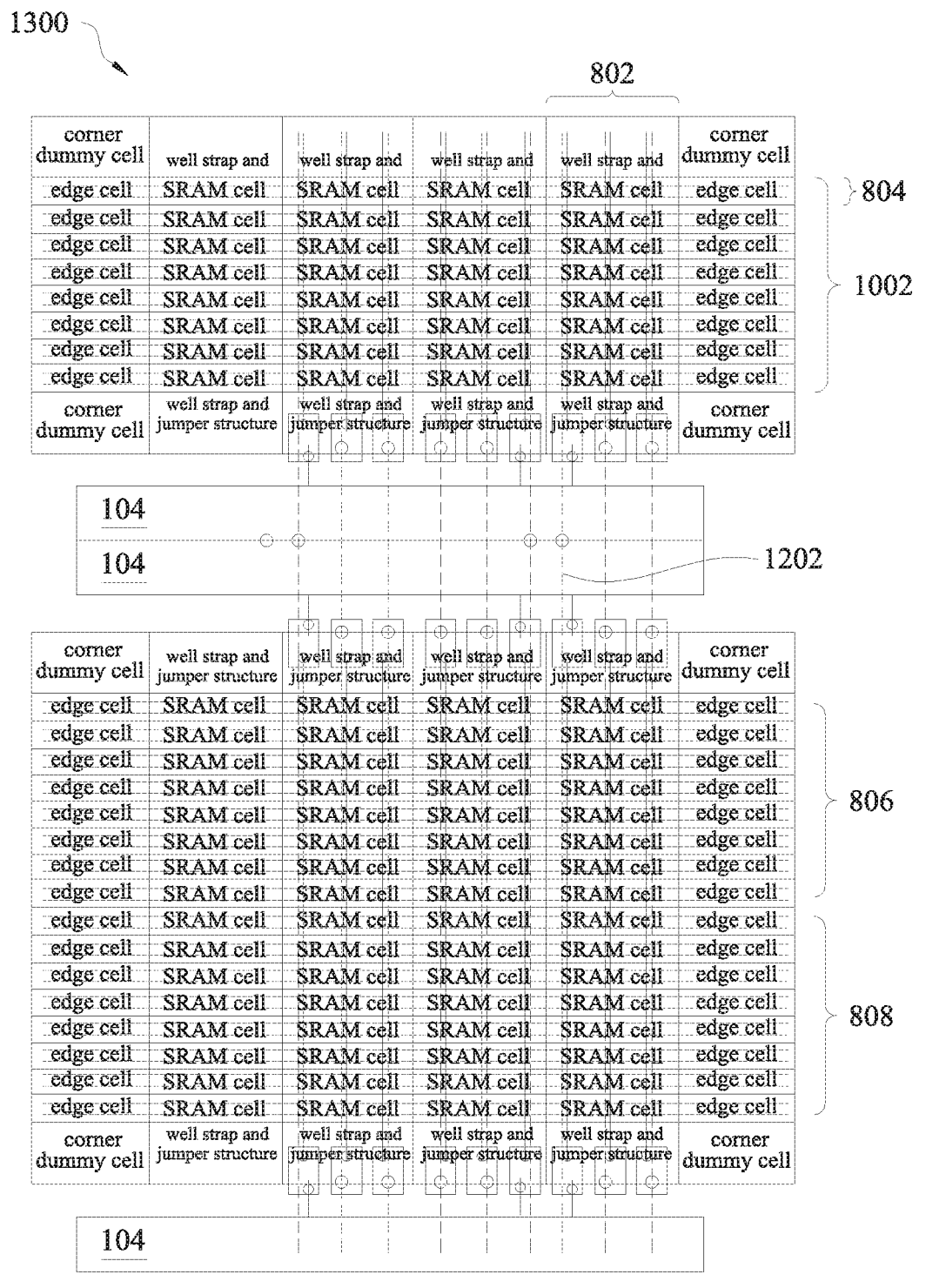

Referring now to FIG. 13A, there is illustrated a block diagram of an SRAM cell array 1300 according to an embodiment of the present disclosure. The SRAM cell array 1300 includes a plurality of two-port SRAM cells 200. Similar to the SRAM cell array 1000 of FIG. 10A, there are a total of 96 two-port SRAM cells 200 in the array 1300. However, they are divided into one 32 cell block and one 64 cell block. The 32 cell block includes SRAM cells that are grouped into 4 columns 802 and 8 rows 804. The 64 cell block includes SRAM cells that are grouped into 4 columns and 16 rows 804. Each column 802 includes 24 two-port SRAM cells 200, while each row 804 includes 4 two-port SRAM cells 200. In some embodiments, the two-port SRAM cells 200 may be implemented as described above in one of FIGS. 3-5.

SRAM cell array 1300 is substantially similar to SRAM cell array 1000, including a third sub array 1002 which is separated from the other two sub arrays 806 and 808 by a block of peripheral logic in peripheral logic area 104. Each sub array 1002, 802, and 804 has 8 rows 804 and 4 columns 802, and therefore contains 32 two-port SRAM cells 200.

As a logic area 104 separates the third sub array 1002 from the bottom sub arrays 806 and 808, third sub array 1002 has its own third sub array write bit line 1006, third sub array inverse write bit line 1008, and third sub array read bit line 1004. Top sub array 806 shares write bit line 212 and inverse write bit line 214 with bottom sub array 808. However, top sub array 806 has its own top read bit line 810 while bottom sub array 808 has its own bottom read bit line 812. The global write bit line 402 and inverse global write bit line 404 serve sub arrays 806, 808, and 1002. Furthermore, global read bit line 1102 serves all sub arrays 806, 808, and 1002. The top read bit line 810 and bottom read bit line 812 are electrically isolated from each other. In some embodiments, the third sub array read bit line 1004 may function similarly to the top or bottom read bit lines 910 or 912, the third sub array write bit line 1006 may function similarly to the write bit line 212, and the third sub array inverse write bit line 1008 may function similarly to the inverse write bit line 214.

In some embodiments, each column 802 is a mirror image of the column on each side of itself. Where each column 802 meets the edge of an SRAM cell block, there may be a jumper structure 610 that connects the two-port SRAM cells 200 of one SRAM cell block to peripheral logic in logic area 104. In the illustrated embodiment, there is peripheral logic between the third and top SRAM cell sub arrays 1002 and 806, as well as on the outer sides of third and bottom SRAM cell sub arrays 1002 and 808, however it is understood that in other embodiments there may be peripheral logic on only one side of the array.

Each row 804 is served by a write word line 210 and a read word line 218 or 418, similar to the rows 804 of SRAM cell array 800 of FIG. 8A.

Figure 13B:
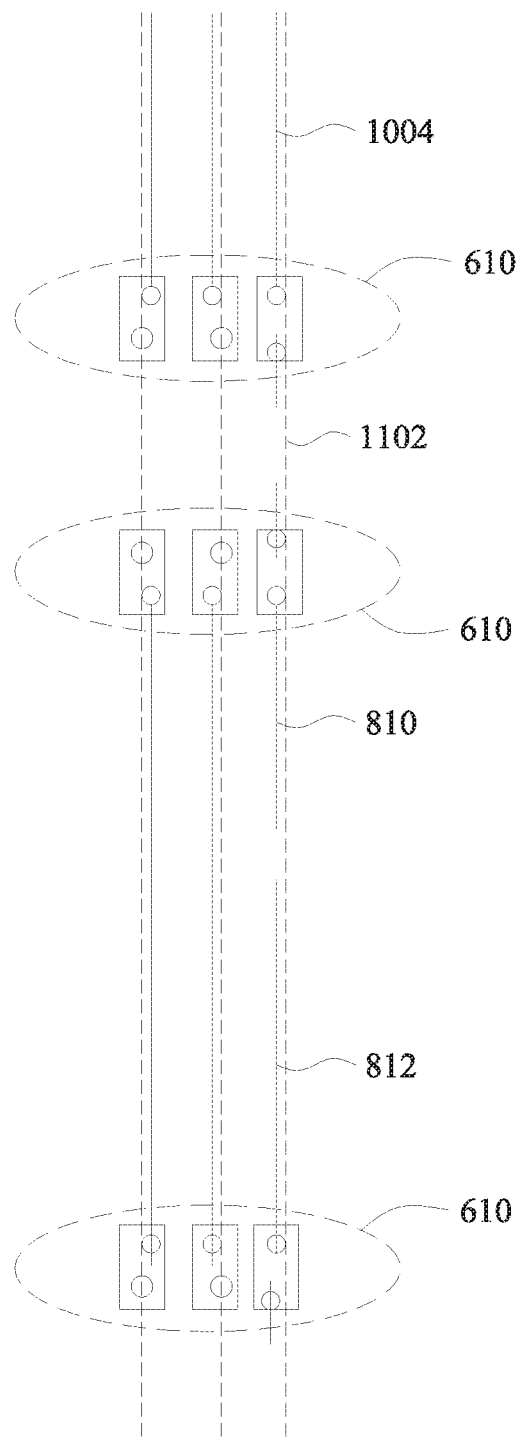

Referring now to FIG. 13B, the columnar set of metal lines overlaying SRAM cell array 1300 is shown without the underlying SRAM array 1300 for clarity. In some embodiments, the set of metal lines is substantially similar to that shown in FIG. 10B, except as described below. The columnar set of metal lines includes third sub array read bit line 1004, top read bit line 810, bottom read bit line 812, and global read bit line 1102. In this view, the jumper structure 610 including vias 408 and 422, connected as described above with respect to FIGS. 6 and 7, is more visible.

A static random access memory (SRAM) structure is provided in accordance with some embodiments. The static random access memory (SRAM) structure includes a plurality of two-port SRAM arrays. Each of the two-port SRAM arrays includes a plurality of two-port SRAM cells, a plurality of edge cells, a plurality of well strap cells, and a plurality of jumper structures. Each two-port SRAM cell includes a write port portion, a read port portion, a first plurality of metal lines, a second plurality of metal lines, and a third plurality of metal lines. The write port portion includes two cross-coupled inverters and two pass devices. The read port portion includes two cascaded devices. The first plurality of metal lines includes a write bit line, an inverse write bit line, a read bit line, a return voltage line, a supply voltage line, a write word line landing pad, and a read word line landing pad, all of which are located in a first metal layer. The second plurality of metal lines includes a write word line located in a second metal layer. The third plurality of metal lines includes a global write bit line and an inverse global write bit line located in a third metal layer. Each jumper structure includes a first metal landing pad located in the second metal layer and electrically connected to the write bit line and to the global write bit line, a second metal landing pad located in the second metal layer and electrically connected to the inverse write bit line and the inverse global write bit line, and a third metal landing pad located in the second metal layer and electrically connected to the read bit line and to a peripheral metal line located in the first metal layer. The plurality of jumper structures extend across an edge of the array.

A static random access memory (SRAM) structure is provided in accordance with some embodiments. The static random access memory (SRAM) structure includes a plurality of two-port SRAM arrays. Each of the two-port SRAM arrays includes a first sub array and a second sub array. The first and second sub arrays each include a plurality of two-port SRAM cells, a plurality of edge cells, a plurality of well strap cells, and a plurality of jumper structures. Each two-port SRAM cell includes a write port portion, a read port portion, a first plurality of metal lines, a second plurality of metal lines, and a third plurality of metal lines. The write port portion includes two cross-coupled inverters and two pass devices. The read port portion includes two cascaded devices. The first plurality of metal lines includes a write bit line, an inverse write bit line, a read bit line, a return voltage line, a supply voltage line, a write word line landing pad, and a read word line landing pad, all of which are located in a first metal layer. The second plurality of metal lines includes a write word line located in a second metal layer. The third plurality of metal lines includes a global write bit line and an inverse global write bit line located in a third metal layer. The write bit line, the inverse write bit line, the global write bit line, and the inverse global write bit line each have a routing length across the first and second sub arrays. The read bit line of the first sub array and the read bit line of the second sub array are physically isolated. Each jumper structure includes a first metal landing pad located in the second metal layer and electrically connected to the write bit line and to the global write bit line, a second metal landing pad located in the second metal layer and electrically connected to the inverse write bit line and the inverse global write bit line, and a third metal landing pad located in the second metal layer and electrically connected to the read bit line and to a peripheral metal line located in the first metal layer. The plurality of jumper structures extend across an edge of the array.

A static random access memory (SRAM) structure is provided in accordance with some embodiments. The static random access memory (SRAM) structure includes a plurality of two-port SRAM arrays. Each of the two-port SRAM arrays includes a first sub array and a second sub array. The first and second sub arrays each include a plurality of two-port SRAM cells, a plurality of edge cells, a plurality of well strap cells, and a plurality of jumper structures. Each two-port SRAM cell includes a write port portion, a read port portion, a first plurality of metal lines, a second plurality of metal lines, and a third plurality of metal lines. The write port portion includes two cross-coupled inverters and two pass devices. The read port portion includes two cascaded devices. The first plurality of metal lines includes a write bit line, an inverse write bit line, a read bit line, a return voltage line, a supply voltage line, a write word line landing pad, and a read word line landing pad, all of which are located in a first metal layer. The second plurality of metal lines includes a write word line located in a second metal layer. The third plurality of metal lines includes a global write bit line, an inverse global write bit line, and a global read bit line, all of which are located in a third metal layer. The write bit line, the inverse write bit line, the global write bit line, the inverse global write bit line, and the global read bit line each have a routing length across the first and second sub arrays. The read bit line of the first sub array and the read bit line of the second sub array are physically isolated. Each jumper structure includes a first metal landing pad located in the second metal layer and electrically connected to the write bit line and to the global write bit line, a second metal landing pad located in the second metal layer and electrically connected to the inverse write bit line and the inverse global write bit line, and a third metal landing pad located in the second metal layer and electrically connected to the read bit line and to a peripheral metal line located in the first metal layer. The plurality of jumper structures extend across an edge of the array.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) device comprising:
   a peripheral logic circuit;
   a plurality of two-port SRAM cells, each two-port SRAM cell comprising:
      a write port portion including a first plurality of transistors; and
      a read port portion including a second plurality of transistors;
   a first plurality of metal lines including a write bit line, an inverse write bit line, a read bit line, a write word line landing pad, and a read word line landing pad, wherein the first plurality of metal lines is located in a first metal layer;
   a second plurality of metal lines including a write word line, wherein the second plurality of metal lines is located in a second metal layer;
   a third plurality of metal lines including a global write bit line and an inverse global write bit line, wherein the third plurality of metal lines is located in a third metal layer; and
   a plurality of jumper structures, each jumper structure comprising:
      a first metal landing pad located in the second metal layer and electrically connected to the write bit line and to the global write bit line;
      a second metal landing pad located in the second metal layer and electrically connected to the inverse write bit line and the inverse global write bit line; and
      a third metal landing pad located in the second metal layer and electrically connected to the read bit line and a peripheral metal line of the peripheral logic circuit, the peripheral metal line located in the first metal layer.

2. The SRAM device of claim 1, wherein:
   the peripheral logic circuit includes parallel metal lines with a first pitch, and
   each of the first, second and third metal landing pads has a width greater than 2 times the first pitch.

3. The SRAM device of claim 1, wherein:
   the plurality of two-port SRAM cells are arranged into a plurality of columns and a plurality of rows, thereby forming a two-port SRAM array,
   the write bit line, inverse write bit line, read bit line, global write bit line, and inverse global write bit line are laid out in a direction that is parallel to a direction of the plurality of columns, and
   each of the plurality of columns includes at least one jumper structure.

4. The SRAM device of claim 3, wherein the plurality of jumper structures includes first jumper structures that extend across a first edge of the array and second jumper structures that extend across a second edge of the array that opposes the first edge of the array.

5. The SRAM device of claim 3, wherein the plurality of jumper structures includes first jumper structures that extend across a first edge of the array.

6. The SRAM device of claim 1, wherein:
the write bit line, the inverse write bit line, the global write bit line, the inverse global write bit line, and the read bit line are routed in a first routing direction,
the write word line is routed in a second routing direction,
the first routing direction is perpendicular to the second routing direction, and
the global write bit line has a width that is at least 1.2 times a width of the write bit line.

7. The SRAM device of claim 1, wherein:
the first plurality of transistors includes first and second pull up devices and first and second pull down devices configured as a pair of cross-coupled inverters,
the second plurality of transistors includes a third pull down device,
the first plurality of metal lines further includes a first return voltage line, a second return voltage line, and a supply voltage line,
the first return voltage line is electrically connected to a source terminal of the first pull down device,
the second return voltage line is electrically connected to source terminals of the second and third pull down devices, and
the supply voltage line is electrically connected to source terminals of the first and second pull up devices.

8. The SRAM device of claim 1, wherein:
the second plurality of transistors includes a third pass-gate device, and
the second plurality of metal lines located in the second metal layer further comprises a read word line connected to a gate terminal of the third pass-gate device.

9. The SRAM device of claim 1, wherein:
the second plurality of transistors includes a third pass-gate device, and
each two-port SRAM cell further comprises a read word line connected to a gate terminal of the third pass-gate device, the read word line located in a fourth metal layer and being routed in a same direction as the write word line, the read word line having a width that is at least 1.5 times a width of the write word line.

10. A static random access memory (SRAM) device comprising:
a peripheral logic circuit;
a first sub array and a second sub array, the first and second sub arrays each comprising:
a plurality of two-port SRAM cells, each two-port SRAM cell comprising:
a write port portion including a first plurality of transistors; and
a read port portion including a second plurality of transistors;
a first plurality of metal lines including a write bit line, an inverse write bit line, a read bit line, a write word line landing pad, and a read word line landing pad, wherein the first plurality of metal lines is located in a first metal layer;
a second plurality of metal lines including a write word line, wherein the second plurality of metal lines is located in a second metal layer; and
a third plurality of metal lines including a global write bit line and an inverse global write bit line, wherein the third plurality of metal lines is located in a third metal layer;
wherein the write bit line, the inverse write bit line, the global write bit line, and the inverse global write bit line each have a routing length across the first and second sub arrays, and
wherein the read bit line of the first sub array and the read bit line of the second sub array are physically isolated; and
a plurality of jumper structures, each jumper structure comprising:
a first metal landing pad located in the second metal layer and electrically connected to the write bit line and to the global write bit line;
a second metal landing pad located in the second metal layer and electrically connected to the inverse write bit line and the inverse global write bit line; and
a third metal landing pad located in the second metal layer and electrically connected to the read bit line and a peripheral metal line of the peripheral logic circuit, the peripheral metal line located in the first metal layer.

11. The SRAM device of claim 10, further comprising a global read bit line located in a third metal layer.

12. The SRAM device of claim 10, wherein the read bit line and the peripheral metal line extend parallel to each other and do not overlap.

13. The SRAM device of claim 10, wherein:
the plurality of two-port SRAM cells are arranged into a plurality of columns and a plurality of rows, thereby forming a two-port SRAM array,
the write bit line, inverse write bit line, read bit line, global write bit line, and inverse global write bit line are laid out in a direction that is parallel to a direction of the plurality of columns, and
each of the plurality of columns includes at least one jumper structure.

14. The SRAM device of claim 10, wherein:
the write bit line, the inverse write bit line, the global write bit line, the inverse global write bit line, and the read bit line are routed in a first routing direction,
the write word line is routed in a second routing direction,
the first routing direction is perpendicular to the second routing direction, and
the global write bit line has a width that is at least 1.2 times a width of the write bit line.

15. The SRAM device of claim 10, wherein:
the first plurality of transistors includes first and second pull up devices and first and second pull down devices configured as a pair of cross-coupled inverters,
the second plurality of transistors includes a third pull down device,
the first plurality of metal lines further includes a first return voltage line, a second return voltage line, and a supply voltage line,
the first return voltage line is electrically connected to a source terminal of the first pull down device,
the second return voltage line is electrically connected to source terminals of the second and third pull down devices, and
the supply voltage line is electrically connected to source terminals of the first and second pull up devices.

16. The SRAM device of claim 10, wherein:
the second plurality of transistors includes a third pass-gate device, and the second plurality of metal lines located in the second metal layer further comprises a read word line connected to a gate terminal of the third pass-gate device.

17. The SRAM device of claim 10, wherein:
the second plurality of transistors includes a third pass-gate device, and
each two-port SRAM cell further comprises a read word line connected to a gate terminal of the third pass-gate device, the read word line located in a fourth metal layer and being routed in a same direction as the write word line, the read word line having a width that is at least 1.5 times a width of the write word line.

18. A static random access memory (SRAM) device comprising:
a peripheral logic circuit;
a first sub array and a second sub array, the first and second sub arrays each comprising:
a plurality of two-port SRAM cells, each two-port SRAM cell comprising:
a write port portion including a first plurality of transistors; and
a read port portion including a second plurality of transistors;
a first plurality of metal lines including a write bit line, an inverse write bit line, a read bit line, a write word line landing pad, and a read word line landing pad, wherein the first plurality of metal lines is located in a first metal layer;
a second plurality of metal lines including a write word line, wherein the second plurality of metal lines is located in a second metal layer; and
a third plurality of metal lines including a global write bit line, an inverse global write bit line, and a global read bit line, wherein the third plurality of metal lines is located in a third metal layer,
wherein the write bit line, the inverse write bit line, the global write bit line, the inverse global write bit line, and the global read bit line each have a routing length across the first and second sub arrays, and
wherein the read bit line of the first sub array and the read bit line of the second sub array are physically isolated; and
a plurality of jumper structures, each jumper structure comprising:
a first metal landing pad located in the second metal layer and electrically connected to the write bit line and to the global write bit line;
a second metal landing pad located in the second metal layer and electrically connected to the inverse write bit line and the inverse global write bit line; and
a third metal landing pad located in the second metal layer and electrically connected to the read bit line and a peripheral metal line of the peripheral logic circuit, the peripheral metal line located in the first metal layer.

19. The SRAM device of claim 18, wherein the metal landing pad of each jumper structure has a length in a first direction parallel to the first plurality of metal lines and a width in a second direction parallel to the second plurality of metal lines, wherein the length is greater than the width.

20. The SRAM device of claim 18, wherein:
the second plurality of transistors includes a third pass-gate device, and
each two-port SRAM cell further comprises a read word line connected to a gate terminal of the third pass-gate device, the read word line located in a fourth metal layer and being routed in a same direction as the write word line, the read word line having a width that is at least 1.5 times a width of the write word line.

* * * * *